(12) United States Patent
Stella et al.

(10) Patent No.: US 11,894,290 B2
(45) Date of Patent: *Feb. 6, 2024

(54) PACKAGED STACKABLE ELECTRONIC POWER DEVICE FOR SURFACE MOUNTING AND CIRCUIT ARRANGEMENT

(71) Applicant: STMICROELECTRONICS S.r.l., Agrate Brianza (IT)

(72) Inventors: Cristiano Gianluca Stella, San Gregorio di Catania (IT); Fabio Vito Coppone, Tremestieri Etneo (IT); Francesco Salamone, Acireale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/150,511

(22) Filed: Jan. 5, 2023

(65) Prior Publication Data

US 2023/0143679 A1 May 11, 2023

Related U.S. Application Data

(63) Continuation of application No. 17/227,030, filed on Apr. 9, 2021, now Pat. No. 11,562,950.

(30) Foreign Application Priority Data

Apr. 17, 2020 (IT) .......................... 102020000008269

(51) Int. Cl.
*H01L 23/495* (2006.01)
*H01L 23/31* (2006.01)
*H01L 23/00* (2006.01)

(52) U.S. Cl.
CPC .... *H01L 23/49537* (2013.01); *H01L 23/3114* (2013.01); *H01L 23/4952* (2013.01);
(Continued)

(58) Field of Classification Search
CPC ............... H01L 24/49; H01L 2924/181; H01L 23/49537; H01L 23/3114; H01L 23/4952;
(Continued)

(56) References Cited

U.S. PATENT DOCUMENTS 5,157,475 A 10/1992 Yamaguchi
5,821,615 A 10/1998 Lee
(Continued)

FOREIGN PATENT DOCUMENTS

CN 103400772 A 11/2013
JP 2011040668 A 2/2011
(Continued)

*Primary Examiner* — Alonzo Chambliss
(74) *Attorney, Agent, or Firm* — Seed IP Law Group LLP

(57) ABSTRACT

A power device for surface mounting has a leadframe including a die-attach support and at least one first lead and one second lead. A die, of semiconductor material, is bonded to the die-attach support, and a package, of insulating material and parallelepipedal shape, surrounds the die and at least in part the die-attach support and has a package height. The first and second leads have outer portions extending outside the package, from two opposite lateral surfaces of the package. The outer portions of the leads have lead heights greater than the package height, extend throughout the height of the package, and have respective portions projecting from the first base.

21 Claims, 14 Drawing Sheets

(52) U.S. Cl.
CPC .. *H01L 23/49513* (2013.01); *H01L 23/49541* (2013.01); *H01L 23/49562* (2013.01); *H01L 23/49568* (2013.01); *H01L 23/49575* (2013.01); *H01L 24/49* (2013.01); *H01L 2924/181* (2013.01)

(58) Field of Classification Search
CPC ......... H01L 23/49562; H01L 23/49575; H01L 23/49513; H01L 23/49541; H01L 23/49568; H01L 23/3107
See application file for complete search history.

(56) References Cited

U.S. PATENT DOCUMENTS

| | | | |
|---|---|---|---|
| 5,835,988 A | 11/1998 | Ishii | |
| 6,040,626 A | 3/2000 | Cheah et al. | |
| 6,630,726 B1 | 10/2003 | Crowley et al. | |
| 6,707,138 B2 | 3/2004 | Crowley et al. | |
| 6,730,544 B1 | 5/2004 | Yang | |
| 6,800,932 B2 | 10/2004 | Lam et al. | |
| 7,279,784 B2 | 10/2007 | Liu | |
| 8,299,588 B1* | 10/2012 | Tateishi | H01L 23/49575 257/676 |
| 9,570,380 B2 | 2/2017 | Coppone et al. | |
| 11,562,950 B2* | 1/2023 | Stella | H01L 23/49513 |
| 2002/0100963 A1 | 8/2002 | Suzuki et al. | |
| 2004/0080028 A1 | 4/2004 | Yanagisawa | |
| 2005/0127494 A1 | 6/2005 | Liu | |
| 2006/0175688 A1 | 8/2006 | Jang | |
| 2007/0052070 A1 | 3/2007 | Islam et al. | |
| 2007/0182003 A1 | 8/2007 | Huber | |
| 2008/0157302 A1 | 7/2008 | Lee et al. | |
| 2009/0001559 A1 | 1/2009 | Satou et al. | |
| 2009/0179315 A1 | 7/2009 | Jereza | |
| 2009/0230519 A1 | 9/2009 | Otremba et al. | |
| 2010/0164078 A1 | 7/2010 | Madrid et al. | |
| 2011/0140252 A1 | 6/2011 | Camacho et al. | |
| 2011/0198741 A1 | 8/2011 | Alberghini et al. | |
| 2011/0227207 A1 | 9/2011 | Yilmaz et al. | |
| 2011/0284997 A1 | 11/2011 | Gong et al. | |
| 2015/0221584 A1 | 8/2015 | Lopez et al. | |
| 2016/0118320 A1* | 4/2016 | Coppone | H01L 24/37 438/123 |
| 2021/0037674 A1 | 2/2021 | Stella et al. | |

FOREIGN PATENT DOCUMENTS

| | | |
|---|---|---|
| WO | 2011077781 A1 | 6/2011 |
| WO | 2015018173 A1 | 2/2015 |

\* cited by examiner

PACKAGED STACKABLE ELECTRONIC POWER DEVICE FOR SURFACE MOUNTING AND CIRCUIT ARRANGEMENT

BACKGROUND

Technical Field

The present disclosure relates to a packaged stackable electronic power device for surface mounting and to a circuit arrangement comprising a plurality of packaged electronic power devices, mutually stacked.

Description of the Related Art

For instance, the device may operate at high voltage (even up to 1700 V) with currents that may switch rapidly, such as silicon carbide or silicon devices, or example MOSFETs, superjunction MOSFETs, IGBTs, and the like, either in bridge (half-bridge or full-bridge) configuration or in A.C. switch configuration, PFC (Power-Factor Correction) circuits, SMPS (Switch-Mode Power Supply) devices.

For such electronic power devices, particular packages have been devised, which enable a high heat dispersion. These packages are generally formed by rigid insulating bodies, for example, of resin, having a parallelepipedal shape, embedding a die integrating the electronic component (s), as well as a dissipation structure arranged between the die, facing the package surface and generally occupying most of a major base of the parallelepipedal shape. The dissipation structure is sometimes formed by the supporting structure (referred to as "leadframe"), of metal, which carries the die and has a plurality of leads for external connection. In general, in this case, the leadframe has a surface directly facing the outside.

For instance, in case of a packaged device comprising a MOSFET or an IGBT, the die integrating the MOSFET generally has a drain contact pad on an own first major surface and at least two contact pads (respectively, a source pad and a gate pad) on a second major surface, opposite to the first surface. A transistor contact pad (typically the drain pad) is fixed to the supporting portion of the leadframe. The other contact pads (typically, the gate and source pads) are coupled to the other leads by bonding wires or clips. This standard package normally envisages arrangement of the leads on the same side of the dissipation structure and thus normally enables dissipation downwards.

The present applicant has further developed a package enabling cooling upwards, thanks to an appropriate configuration of the supporting portion of the leadframe and of the leads. In particular, this solution envisages a leadframe formed by a DBC (Direct-Bonded Copper) multilayer, which enables arrangement of two or more dice arranged side by side, each coupled, with its own drain pad, to a different portion, electrically insulated from the adjacent portions, of one of the conductive layers of the DBC supporting multilayer. Drain leads are fixed to the various portions of the conductive layer; the other contact pads (source and drain pads) are connected to leads of their own. This solution, allowing different circuit topologies and components to be formed generally utilizes a large area when many dice are provided, due to the side-by-side arrangement thereof.

Italian patent application No. 102019000013743, filed on Aug. 1, 2019, in the name of the present applicant, describes a packaged electronic power device allowing arrangement of various dice on different levels, using electrically insulating and thermally conductive multilayer supports.

The above solution, very effective for devices with bridge connection, is however somewhat complex in case of simpler circuits or when a high power is desired (and thus it is desired to dissipate high heat).

BRIEF SUMMARY

In various embodiments, the present disclosure provides a device that overcomes the limitations of the prior art.

According to the present disclosure, a stackable, packaged electronic power device for surface mounting and a circuit arrangement are provided.

In at least one embodiment, a power device for surface mounting is provided that includes a leadframe including a die-attach support, a first lead and a second lead. A die, of semiconductor material, is bonded to the die-attach support. A package of insulating material is included that has a parallelepipedal shape. The package has a first lateral surface, a second lateral surface, a first base and a second base, and the first and second lateral surfaces define a package height. The package surrounds the die and at least partially surrounds the die-attach support. The first and second leads have outer portions extending outside the package, respectively from the first lateral surface and from the second lateral surface of the package. The outer portions of the leads have lead heights greater than the package height, extending throughout the height of the package, and have respective portions projecting from the first base.

In at least one embodiment, a mounted electronic device is provided that includes a power device. The power device includes a leadframe including a die-attach support, a first lead and a second lead. A die, of semiconductor material, is bonded to the die-attach support. A package of insulating material is included that has a parallelepipedal shape. The package has a first lateral surface, a second lateral surface, a first base and a second base, and the first and second lateral surfaces define a package height. The package surrounds the die and at least partially surrounds the die-attach support. An insulating substrate has a first face and a second face. A first heat sinker is in contact with the second base of the package. The first and second leads have outer portions extending outside the package, respectively from the first lateral surface and from the second lateral surface of the package. The outer portions of the leads have lead heights greater than the package height, extending throughout the height of the package, and have respective portions projecting from the first base. The power device is bonded to the first face of the insulating substrate with the first base of the package facing the substrate, and the outer portions of the leads of the power device are in contact with the first face of the substrate.

In at least one embodiment, a circuit arrangement is provided that includes a substrate and a first plurality of power devices. Each of the first plurality of power devices includes a leadframe including a die-attach support, a first lead and a second lead. A die, of semiconductor material, is bonded to the die-attach support. A package of insulating material is included that has a parallelepipedal shape. The package has a first lateral surface, a second lateral surface, a first base and a second base, and the first and second lateral surfaces define a package height. The package surrounds the die and at least partially surrounds the die-attach support. The power devices further include heat sinkers of thermally conductive material. The first and second leads have outer portions extending outside the package, respectively from the first lateral surface and from the second lateral surface of the package. The outer portions of the leads have lead heights greater than the package height, extending throughout the height of the package, and have respective portions projecting from the first base. A first power device of the first plurality of power devices is bonded to a first face of the substrate, and the power devices of the first plurality of power devices are stacked to form a first stack of stacked power devices. The outer portions of the first and second leads of each power device of the first stack are arranged on top of each other and are bonded to the outer portions of the first and second leads, respectively, of a power device arranged at the bottom in the first stack. The first heat sinkers are arranged between the stacked power devices of the first stack.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

DETAILED DESCRIPTION

In the following description, the spatial indications such as "above," "below," "at the top," "at the bottom," "overlying," "underlying," "on the left," "on the right" and the like refer to the represented figures and are to be understood only in a relative sense.

FIGS. 1-8 show a power device 1, such as a MOSFET, for example, of silicon carbide or silicon, but the description below applies to devices of different types, such as superjunction MOSFETs, IGBTs and the like, and power circuits comprising such devices, for example, circuits in bridge (half-bridge or full-bridge) configuration or in A.C. switch configuration, PFC (Power-Factor Correction) circuits, and SMPS (Switch-Mode Power Supply) devices.

Figure 1:
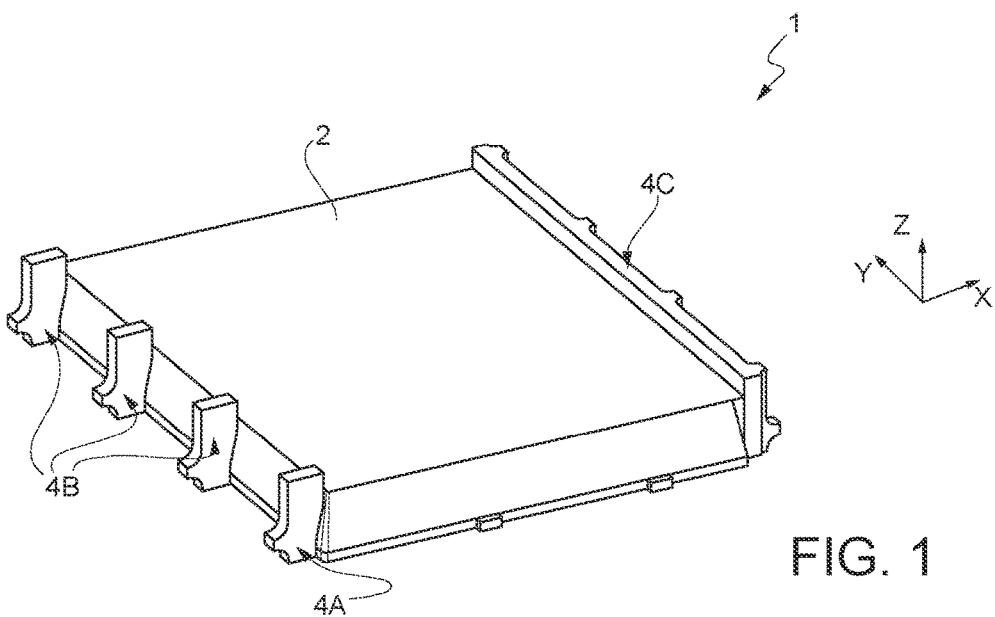
FIG. 1 is a perspective view of a packaged power device, according to the present disclosure.
Figure 2:
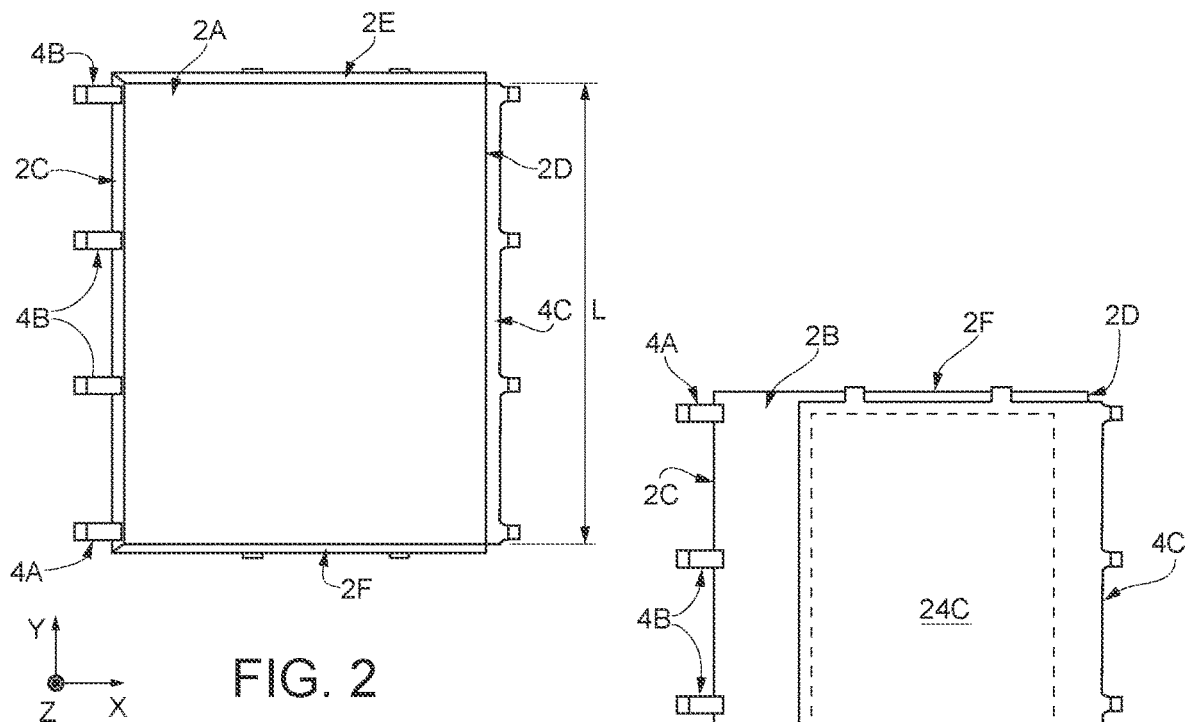
FIGS. 2-6 are, respectively, a top view, a bottom view, a front view, a left lateral view, and a right lateral view of the power device of FIG. 1.
Figure 3:
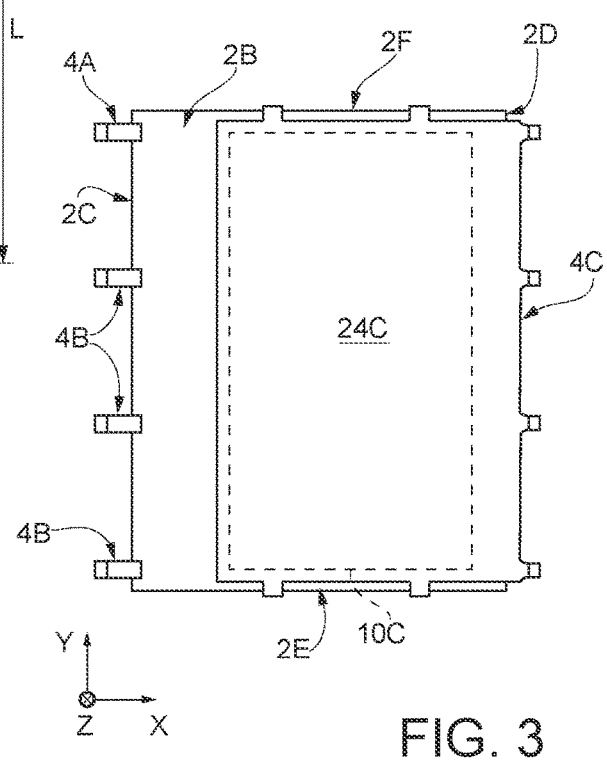
Figure 7:
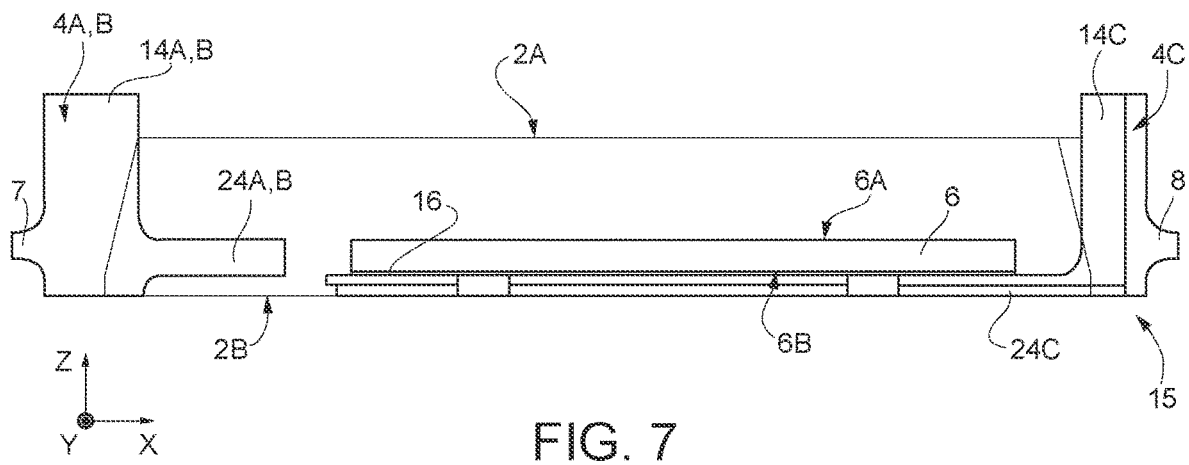
FIG. 7 is a lateral view, partially phantom, of the power device of FIG. 1.
Figure 8:
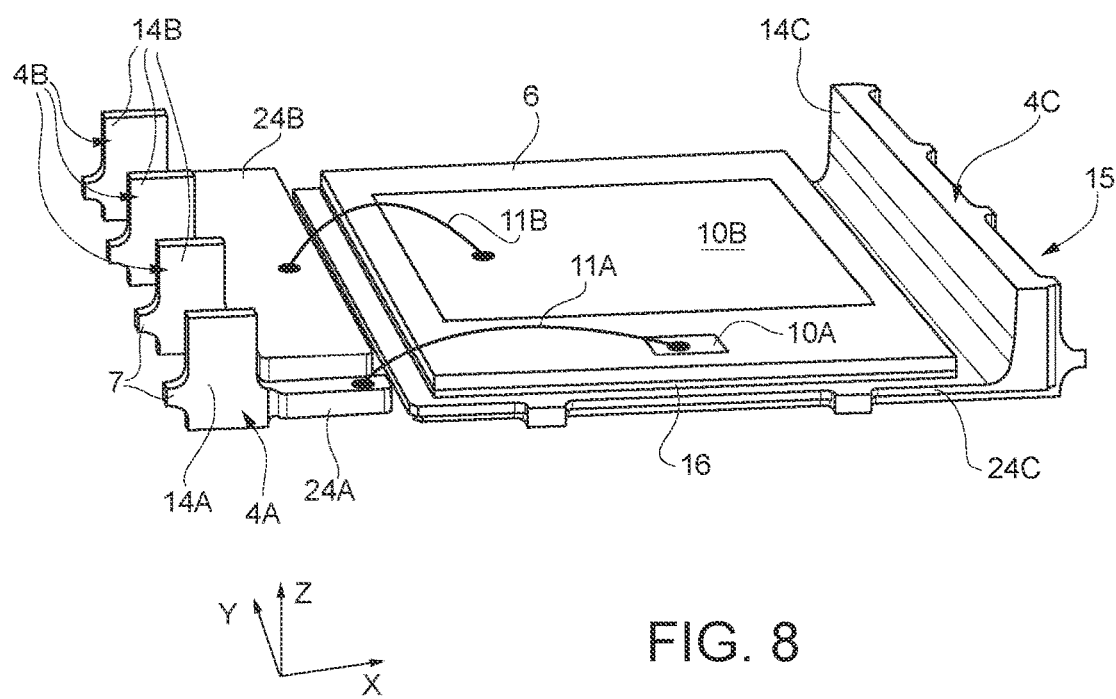
FIG. 8 is a perspective view of the device of FIG. 1, without package.

The power device 1 comprises a package 2 of electrically insulating material, such as resin, embedding a die 6 (FIGS. 7 and 8). The die 6 has a first face 6A (at the top in FIG. 7) and a second face 6B (at the bottom in FIG. 7) where contact pads are formed, in a known way, of which FIG. 8 shows schematically only gate contact pads 10A and source contact pads 10B. The gate pads 10A and source pads 10B are arranged on the first face 6A; a drain pad 10C, not visible and represented schematically with dashed line in FIG. 3, is arranged on the second face 6B. The contact pads 10A-10C are connected, in a known way described in greater detail hereinafter, to a supporting structure, so-called leadframe, designated as a whole by 15 (FIG. 7), comprising leads (here designated by 4A-4C) in part embedded in the package 2 and in part projecting therefrom and configured to enable surface mounting.

In detail, the leads 4A-4C here form one gate lead 4A, three source leads 4B, and one drain lead 4C.

The package 2 has a generally parallelepipedal shape, here slightly flared, having a first base 2A (here represented at the top) parallel to a first plane XY of a Cartesian coordinate system, a second base 2B, also parallel to the first plane XY, and four lateral surfaces 2C-2F, extending transversely to the first plane XY. Since the first and second bases 2A, 2B and the lateral surfaces 2C-2F of the package 2 also form the top and bottom faces as well as the lateral faces of the power device 1 (except for outer portions of the leads, as explained below), hereinafter, for simplicity, the faces of the power device 1 will be designated by the same numbers as the bases 2A, 2B and the lateral surfaces 2C-2F of the package 2 even when, in the embodiments shown and discussed hereinafter, the top and bottom faces of the power device 1 are occupied in part by conductive structures and the outer portions of the leads extend on the lateral faces.

In the embodiment shown in FIGS. 1-8, the second base 2B has a slightly greater area than the first base 2A; the four lateral surfaces define a first lateral surface 2C, a second lateral surface 2D (opposite to the first lateral surface 2C), a third lateral surface 2E, and a fourth lateral surface 2F (opposite to the third lateral surface 2E). The gate lead 4A and the source leads 4B are arranged along the first lateral surface 2C, at a uniform distance from each other (along a first Cartesian axis Y of the Cartesian coordinate system having further a second Cartesian axis X and a third Cartesian axis Z); the drain lead 4C is arranged on the second lateral surface 2D, as explained in detail hereinafter.

The gate lead 4A and source leads 4B have respective outer portions 14A, 14B (hereinafter also called pins 14A, 14B), projecting from the package 2, and inner portions 24A, 24B, visible in FIG. 8 and embedded in the package 2.

Here, the pins 14A and 14B of the gate lead 4A and source leads 4B are formed by laminas, with a much smaller thickness than the other dimensions (and are thus substantially planar), have equal shapes, generally rectangular, and extend perpendicular to the first lateral surface 2C (parallel to a second plane XZ of the Cartesian coordinate system).

The pins 14A and 14B of the gate lead 4A and source leads 4B have a greater height (in a direction parallel to a third Cartesian axis Z of the Cartesian coordinate system) than the package 2, with a first edge (the bottom edge in FIGS. 4-7) flush with the second face 2B of the package 2 and a second edge (the top edge in FIGS. 4-7) projecting with respect to the first face 2A of the package 2.

Figure 4:
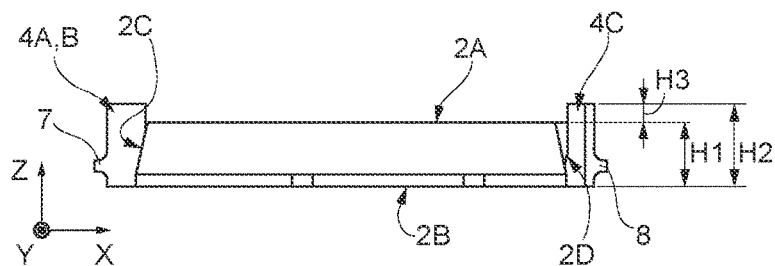

The pins 14A and 14B of the gate lead 4A and source leads 4B further each have a respective gate/source projection 7 facing the outside of the package 2 (see, in particular, FIGS. 4 and 7). These projections may be useful for positioning tips of tester probes, during measurement.

The inner portions 24A and 24B of the gate and source leads 4A, 4B extend parallel to the first plane XY (FIG. 8).

In detail, the inner portion 24A of the gate lead 4A is formed by a thick lamina portion, having an approximately parallelepipedal shape, with bases parallel to the first plane XY and a width (in a direction parallel to the first Cartesian axis Y) greater than the respective outer portion 14A for enabling soldering of a first electrical bonding wire 11A to the gate contact pad 10A (FIG. 8).

The inner portion 24B of the source leads 4B is common, has an approximately parallelepipedal shape with bases parallel to the first plane XY, is elongated in a direction parallel to the first Cartesian axis Y, is rigid with, and electrically connected, to the outer portions 14B of all three source leads 4B. The inner portion 24B of the source leads 4B is further electrically connected to the source pad 10B through one or more wires 11B (one whereof is shown in FIG. 8).

Figure 7A:
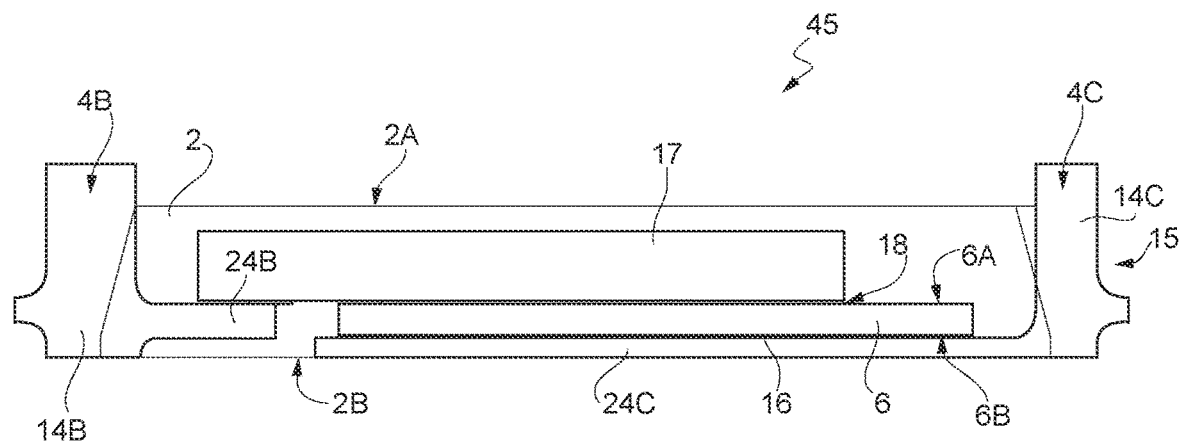
FIG. 7A shows a variant of the lateral view of FIG. 7.

As an alternative to wire bonding 11B, as shown in FIG. 7A, the inner portion 24B of the source leads 4B may be electrically connected to the source pad 10B through a flat metal region or clip 17, parallelepiped-shaped, embedded in the resin of the package 2 that forms the first base 2A and that here extends between the metal region or clip 17 and the first base 2A. The flat metal region or clip 17 is fixed through an adhesive layer 18, for example, a solder paste, as described in detail hereinafter with reference to FIG. 16 (specifically with reference to the second conductive layer 39, described there).

The drain lead 4C has an outer portion 14C extending along the second lateral surface 2D of the package 2 and a bottom portion 24C facing the second base 2B of the package 2.

In detail, the lateral portion 14C of the drain lead 4C is bar-shaped (and is consequently also referred to hereinafter as bar 14C), is contiguous with the second lateral surface 2D of the package 2 and extends throughout the length thereof (on the first base 2A, designated by L in FIG. 2 and measured parallel to the first Cartesian axis Y), approximately parallel to a third plane YZ of the Cartesian coordinate system.

The bar 14C of the drain lead 4C has the same height (in the direction of the third Cartesian axis Z) as the pins 14A and 14B of the gate lead 4A and source leads 4B and thus has a first edge (the bottom edge in FIGS. 4-7) flush with the second face 2B of the package 2 and a second edge (the top edge in FIGS. 4-7) projecting from the first face 2A of the package 2.

The bar 14C of the drain lead 4C is further provided with a drain projection 8 facing the outside of the package 2 (see, in particular, FIGS. 4 and 7).

The bottom portion 24C of the drain lead 4C forms a die-attach support (consequently hereinafter also referred to as die-attach support 24C and is also known as "die-attach pad") and is formed by a metal die with rectangular area, partially embedded in the package 2, so that its bottom (exposed) surface is flush with the second base 2B. In particular, the die-attach support 24C has a length (parallel to the first Cartesian axis Y) substantially equal to the length L of the bar 14C and extends (in the direction of a second Cartesian axis X of the Cartesian coordinate system) from the bar 14C as far as in proximity of the inner portions 24A and 24B of the gate and source leads 4A, 4B, so as to occupy most of the area of the second base 2B of the package 2 (see also FIG. 3), but at a safety distance from the gate and source leads 4A, 4B, taking into account operating parameters, such as the voltages foreseen during operation and possible other conditions, in a way known to the person skilled in the art, so as to respect the so-called creepage distance.

The die-attach support 24C carries the die 6, which is bonded to a top surface thereof via a first adhesive layer 16, for example, a conductive solder paste, which enables electrical contact between the drain pad (not shown, 10C in FIG. 3) arranged on the second face 2B of the die 6 and the die-attach support 24C, in a known way.

Figure 5:
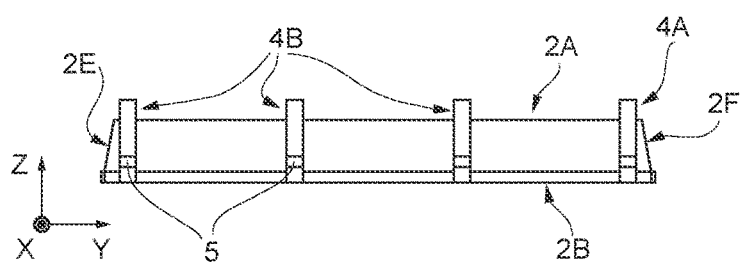
Figure 6:
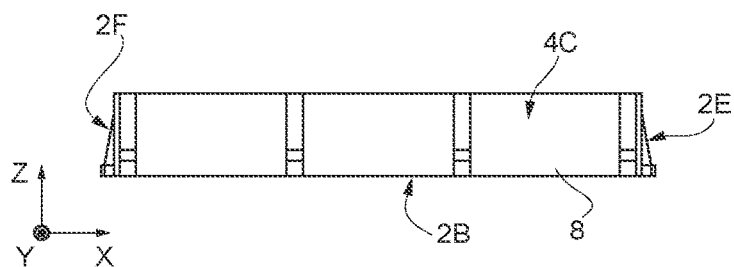

As already mentioned, the pins 14A and 14B of the gate lead 4A and source leads 4B and the bar 14C have the same height, are higher than the package 2 and project from the first base 2A thereof, as visible in FIGS. 4-6. In particular, with reference to FIG. 4, if H1 is the height of the package 2, and H2 is the height of the gate lead 4A, source leads 4B and of the bar 14C, H2>H1. Consequently, the distance between the first base 2A of the package 2 and the projecting edge of the outer portions 14A-14C of the leads 2A-2C is H3=H2−H1 (spacing distance). For instance, in one embodiment, the package 2 may have a height H1 of 2.3 mm, and the pins 14A, 14B and the bar 14C may have a height H2 of 3-4.3 mm; thus, H3 may be 0.7-1 mm.

By virtue of the above characteristic, the power device 1 may be mounted on a substrate, on both sides thereof, may be coupled to heat sinkers, and may be stacked, as discussed in detail hereinafter.

Figure 9:
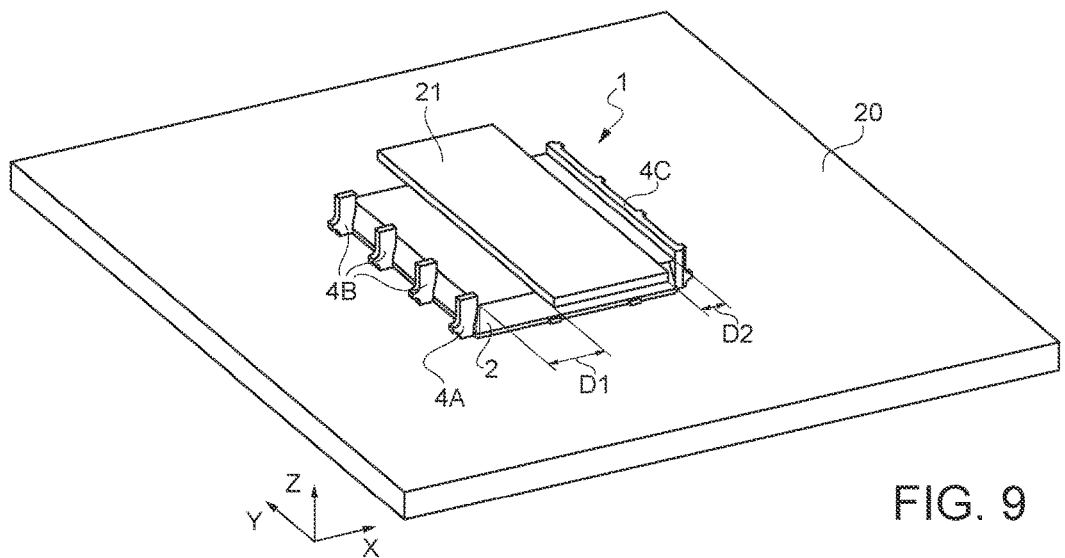
FIG. 9 is a perspective view of the power device of FIG. 1 mounted on a support, in a configuration.

For instance, FIG. 9 shows a configuration where the power device 1 is fixed to a substrate 20, with the leadframe 15 facing downwards, and a heat sinker is arranged on top of the power device 1. It is stressed that the expression "leadframe 15 facing downwards" indicates that the die-attach support 24C faces downwards, i.e., towards the substrate 20 (first base 2A facing upwards and second base 2B of the package 2 facing downwards) and the pins 14A and 14B of the gate lead 4A and source leads 4B and the bar 14C project upwards.

The substrate 20, for instance a printed-circuit board of FR4, is generally insulating, for example, of glass fiber with interposed conductive layers for connections, in a way known and not shown. In the configuration of FIG. 9, the leads 4A-4C are fixed to the substrate 20 in a way not shown and in a per se known manner, for example, through soldering to conductive paths (not shown).

A heat sinker (dissipation plate) 21 is fixed to the first base 2A of the package 2, for example, glued or screwed to the substrate 20 via supports not shown in the figure.

The heat sinker 21 is formed by a lamina of conductive material, typically metal such as copper or aluminium. The heat sinker 21 has, for example, a rectangular shape, with a length (parallel to the first Cartesian axis Y) greater than the length L of the bar 14C and of the package 2 and a width (parallel to the second Cartesian axis X) smaller than the package 2. Further, the heat sinker 21 is fixed at a distance from the leads 4A-4C; in particular, a first distance D1 (FIG. 9) of the heat sinker 21 from the gate lead 4A and source leads 4B is appropriately chosen, in the direction of the second Cartesian axis X, taking into account operating parameters, such as the voltages foreseen during operation and other possible conditions, in a way known to the person skilled in the art (creepage distance). Likewise, a second distance D2 (FIG. 9) between the heat sinker 21 and the bar 14C is chosen in the design stage so as to satisfy creepage criteria, if necessary or desired.

The heat sinker 21 further has, for example, a thickness equal to the spacing distance H3, even though in this configuration the thickness is not critical.

The heat sinker 21 is thus physically in direct contact with the first base 2A of the package 2 and enables thermal dissipation of the power device 1 upwards.

Figure 10:
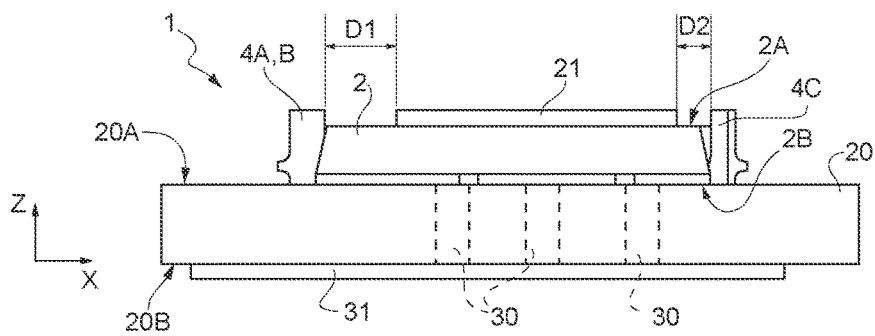
FIG. 10 is a lateral view of the power device of FIG. 1, mounted on a support and with a rear heat sinker.
Figure 11:
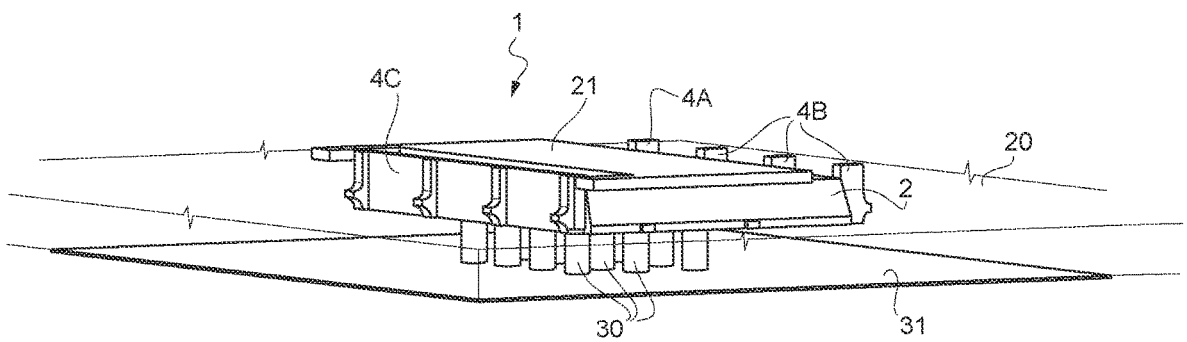
FIG. 11 is a perspective, partially phantom view of the mounting configuration of FIG. 10.

To increase thermal dissipation of the power device 1, it is possible to thermally couple it to a dissipating lamina arranged on an opposite side of the substrate 20, so as to obtain dissipation also downwards, as shown in the configuration of FIGS. 10 and 11.

In FIGS. 10 and 11, the substrate 20, also here, for example, a printed-circuit board, has a first face 20A and a second face 20B. The power device 1 is fixed to the first face 20A of the substrate 20, possibly through an adhesive layer, such as a solder paste, not shown. Connection vias 30, for example, of metal, such as copper, extend through the substrate 20, and are thermally and electrically conductive. The connection vias 30, represented dashed in FIG. 10, extend between the first and second faces 20A, 20B of the substrate 2 and are in physical contact with the second base 2B of the package 2 (possibly through the adhesive layer, not shown), on the first face 20A, and thus with the drain pad 10C (FIG. 3), and with a dissipating lamina 31 extending on the second face 20B of the substrate 20.

The dissipating lamina 31 may have any shape, with a generally greater area than the power device 1 to provide a high thermal dissipation. To this end, the dissipating lamina 31 is made of thermally conductive material, for example, a metal such as copper. Consequently, in this configuration, the dissipating lamina 31 is in electrical contact with the drain pad 10C (FIG. 3) of the power device 1.

The configuration of FIGS. 10 and 11 thus provides an increased dissipation as compared to the configuration of FIG. 9.

Figure 12:
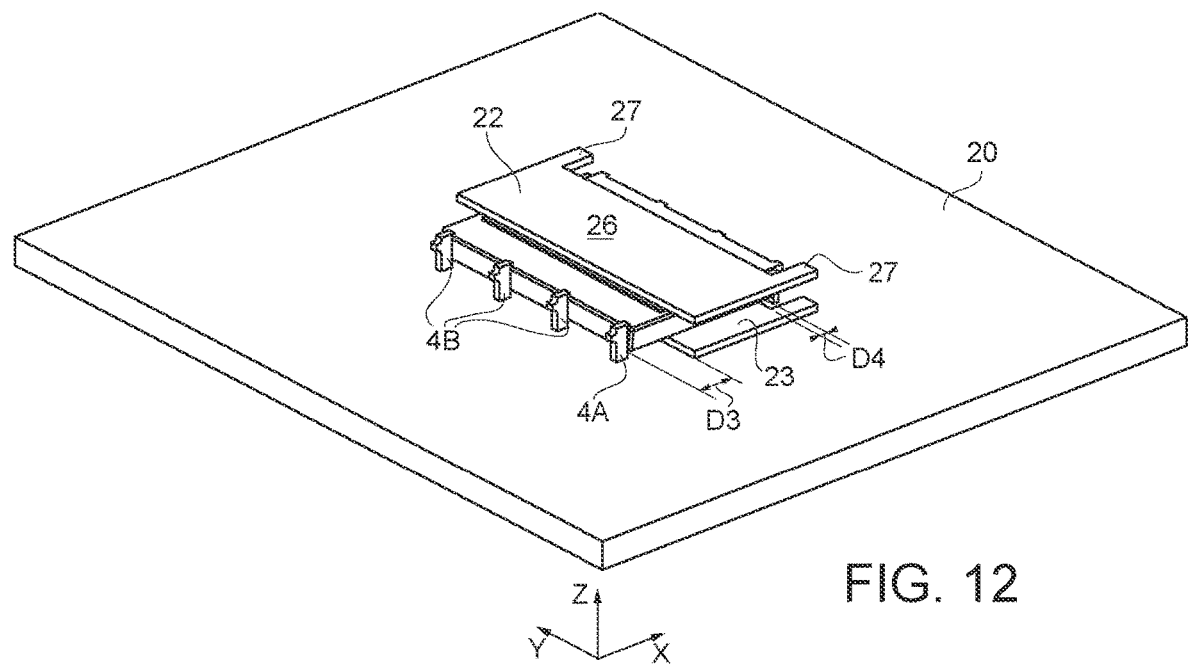
FIG. 12 is a perspective view of the power device of FIG. 1 mounted on a support, in another configuration.
Figure 13:
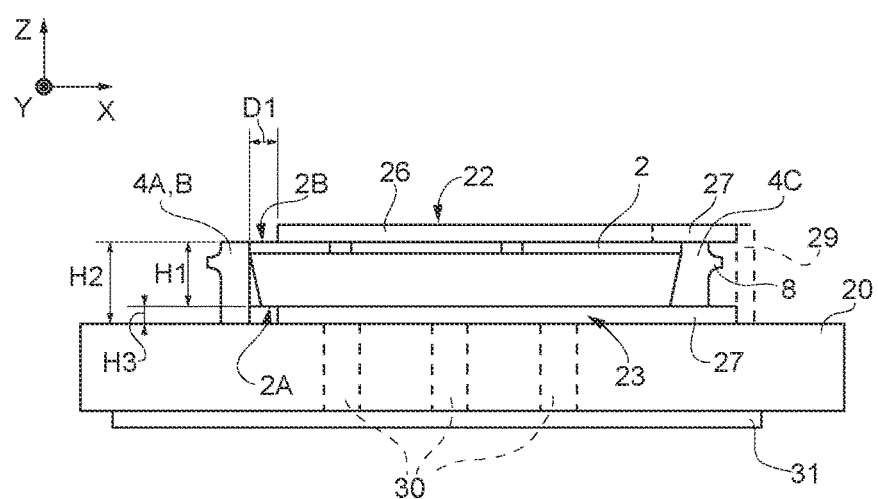
FIG. 13 is a lateral view of the mounted power device of FIG. 12 with a rear heat sinker.
Figure 14:
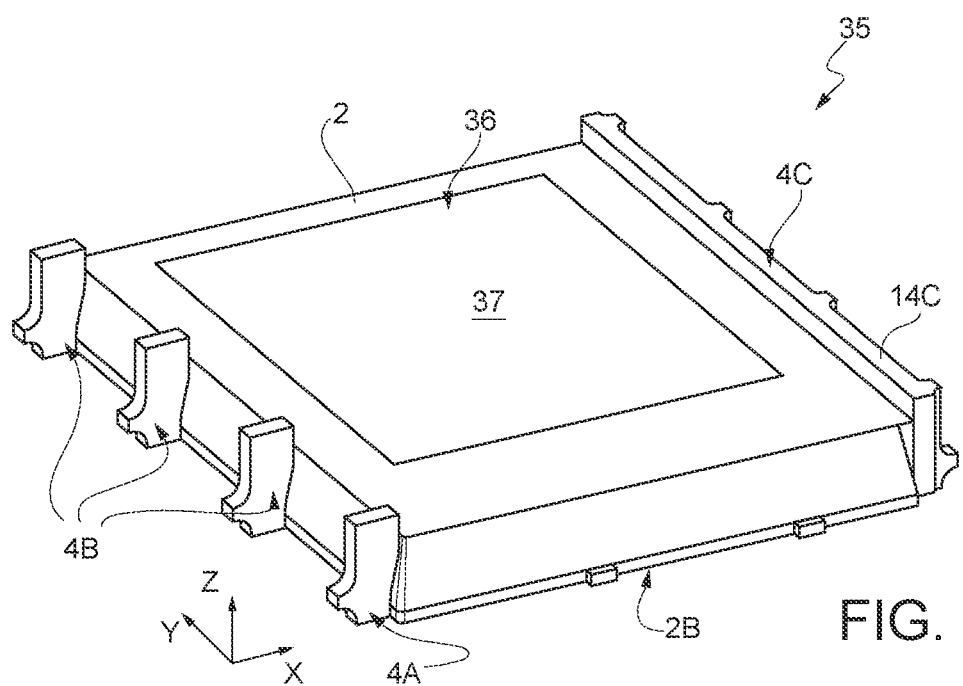
FIGS. 14 and 15 are, respectively, a perspective view and a bottom view of a packaged power device, according to a different embodiment.
Figure 15:
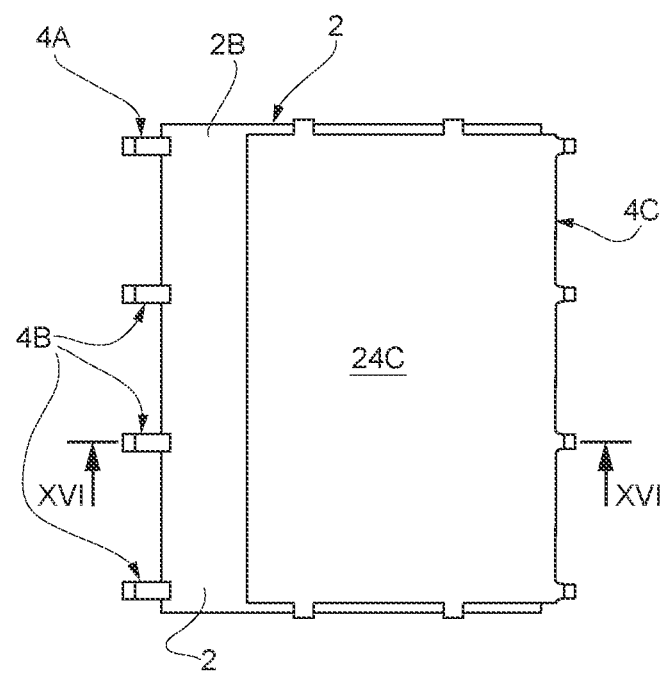

FIGS. 12 and 13 show a configuration where the power device 1 is fixed to the substrate 20 with the leadframe 15 facing upwards (at a distance from the substrate 20), and heat sinkers are arranged both on top and underneath the power device 1.

It should be noted that the expression "leadframe 15 facing upwards" indicates that the die-attach support 24C faces upwards (first base 2A of the package 2 facing downwards, towards the substrate 20, and second base 2B of the package 2 facing upwards) and the pins 14A and 14B as well as the bar 14C project downwards.

In this way, in the configuration of FIGS. 12-13, the package 2 of the power device 1 is raised with respect to the substrate 20 by the spacing distance H3.

In the configuration of FIGS. 12-13, a first heat sinker 22 is fixed to the second base 2B of the package 2 (on top of this) and a second heat sinker 23 is fixed to the first base 2A of the package 2, in the gap between the substrate 20 and the package 2.

The first and second heat sinkers 22, 23 have here a thickness equal to the spacing distance H3. Furthermore, they may have any shape, for example, a simple rectangular shape. In the embodiment shown, they have the same shape, generally a C shape, with a main portion 26 having a rectangular shape elongated in a direction parallel to the first Cartesian axis Y and a pair of legs 27 that extend from adjacent edges of a long side of the main portion 26, facing the bar 14C. The length of the heat sinkers 22, 23 (in the direction of the first Cartesian axis Y) is greater than the length L (FIG. 2) of the package 2, and the legs 27 extend outside the package 2, alongside and at a distance from the bar 14C. The heat sinkers 22, 23 are further arranged vertically on top of each other.

As discussed in detail hereinafter, it is thus possible to arrange, if so desired, a vertical wall 29 (represented with a dashed line in FIG. 13) in thermal contact with the first and second heat sinkers 22, 23, and possibly with the drain lead 4C, but insulated with respect to the gate and source leads 4A, 4B, in order to respect the creepage distance.

In FIG. 13, the vertical wall 29 extends alongside the power device 1, facing the bar 14C, with main extension parallel to the third plane YZ of the Cartesian coordinate system (thus, perpendicular to the substrate 20).

The first and second heat sinkers 22, 23 (and the vertical wall 29, if present) are made of conductive material, typically metal such as copper or aluminium; further, the heat sinkers 22, 23 preferably have a thickness equal to the spacing distance H3.

Consequently, the main portion 26 of the second heat sinker 23 is arranged laterally between the projecting portions of the leads 4A-4C.

In addition, the main portion 26 is arranged vertically between the first base 2A of the package 2 and the substrate 20, physically in direct contact with them, and enables thermal dissipation of the power device 1 downwards.

Also in this case, the substrate 20 may have connection vias 30, connecting the second heat sinker 23 to the dissipating lamina 31.

The first heat sinker 22, as mentioned, is fixed to the second base 2B of the package 2, specifically to the die-attach support 24C. Since the die 6 (here not visible) lies directly on the die-attach support 24C, the first heat sinker 22 is not insulated from the die 6. Furthermore, in presence of the vertical wall 29 connecting the first heat sinker 22 to the second heat sinker 23, the latter is not electrically insulated from the die 6, either.

It is noted that, in FIG. 13, the vertical wall 29 is arranged at a distance from the drain projection 8 of the bar 14C, even though this is not necessary in this case, since the vertical wall 29 is electrically connected to the drain pad 10C (FIG. 3) through the first heat sinker 22.

In practice, the heat sinkers 22, 23, the vertical wall 29 (if present), and the dissipating lamina 31 (if present) form a heat-dissipation structure for the die 6. In this way, in the configuration of FIGS. 12 and 13, the power device 1 provides a high thermal dissipation.

Also the structure of FIGS. 12-13 is designed so as to respect the creepage criteria as regards the first distance D1, between the first heat sinker 22 and the gate and source pins 14A, 14B (FIG. 12), a third distance D3, between the second heat sinker 23 and the gate and source pins 14A, 14B (FIG. 13), as well as a fourth distance D4 between the second heat sinker 23 and the bar 14C (FIG. 13).

FIGS. 14-18 show a power device 35 having an inner dissipating lamina, insulated with respect to the die 6.

The power device 35 has a base structure similar to that of the power device 1 shown in FIGS. 1-8, so that parts that are similar are designated by the same reference numbers and will not be described any further.

The power device 35 of FIGS. 14-18 (having equal below and lateral views as the power device 1 of FIGS. 3 and 4-6 so that these views are not represented again) comprises an insulating dissipative region 36 (also referred to as insulating clip), embedded in the package 2 and extending between the die 6 and the first base 2A of the package 2.

Figure 16:
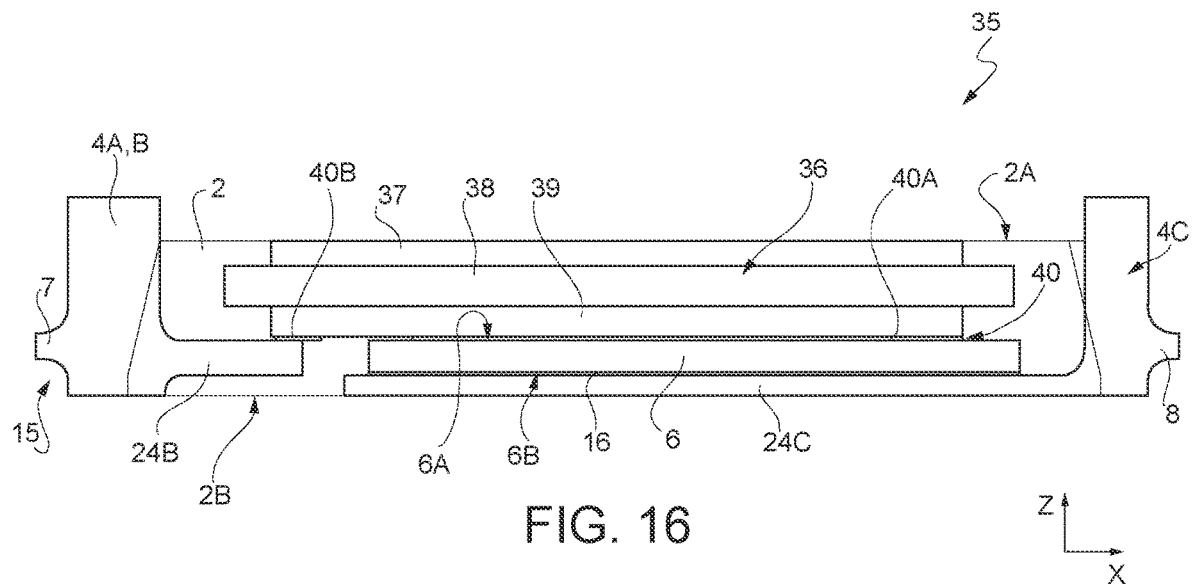
FIG. 16 is a cross-section, taken along line XVI-XVI of FIG. 15, of the power device of FIGS. 14 and 15, before packaging.

The insulating dissipative region 36 is here a DCB (Direct Copper Bonding) substrate; namely, it is formed by a triple layer, including a first conductive layer 37, an intermediate insulating layer 38, and a second conductive layer 39, as may be seen in particular in FIG. 16.

Here, the first conductive layer 37 has a top surface that extends flush with the first base 2A of the package 2 and occupies most part of the area of the first base 2A. The intermediate insulating layer 38 extends underneath the first conductive layer 37 and has a greater area than the first conductive layer 37. The second conductive layer 39 is bonded to the die 6 through a second adhesive layer 40, as explained in detail hereinafter.

The first and second conductive layers 37, 39 are made of electrically and thermally conductive material, typically metal, such as copper. The intermediate insulating layer 38 may be of alumina ($Al_2O_3$), which has excellent characteristics of electrical insulation, but is a good thermal conductor, so that the first base 2A of the package 2 is electrically insulated from the die 6, even at high voltages, but is thermally connected thereto.

The second adhesive layer 40 is obtained, for example, from a conductive solder paste, patterned so as to form a first adhesive portion 40A and a second adhesive portion 40B. The first adhesive portion 40A extends between the second conductive layer 39 and the die 6 so as to be in direct contact with the source pad 10B (FIG. 8). The second adhesive portion 40B extends between the second conductive layer 39 and the inner portion 24B of the source leads 4B. In practice, in this embodiment, the second conductive layer 39 of the insulating dissipative region 36 enables electrical contact between the source pad 10B (not visible in FIGS. 16-18) and the source leads 4B.

Figure 17:
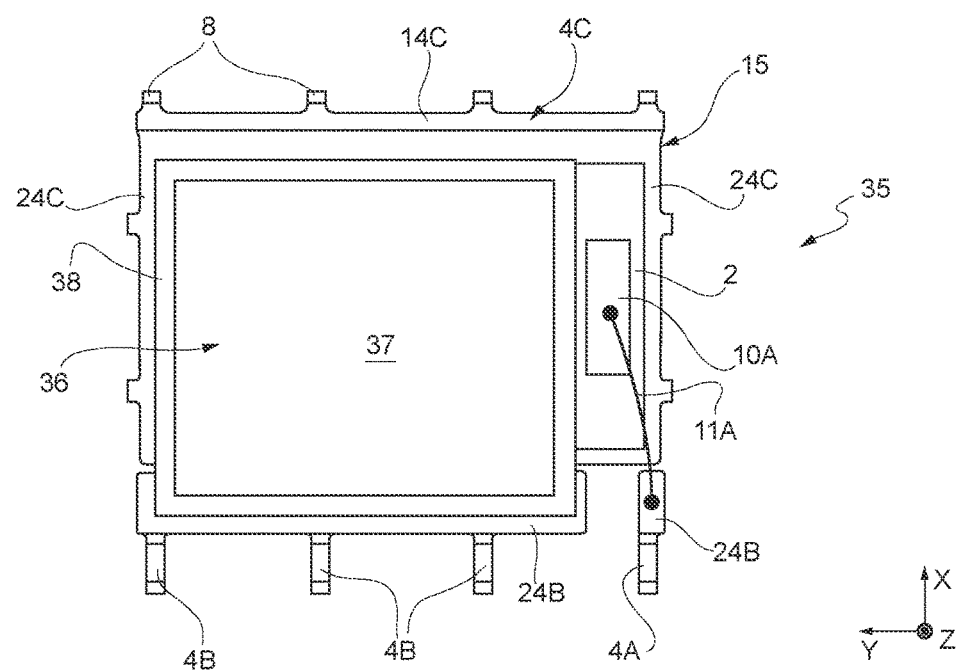
FIGS. 17-18 are, respectively, a top plan view and a top perspective view of the power device of FIGS. 14 and 15, before packaging.
Figure 18:
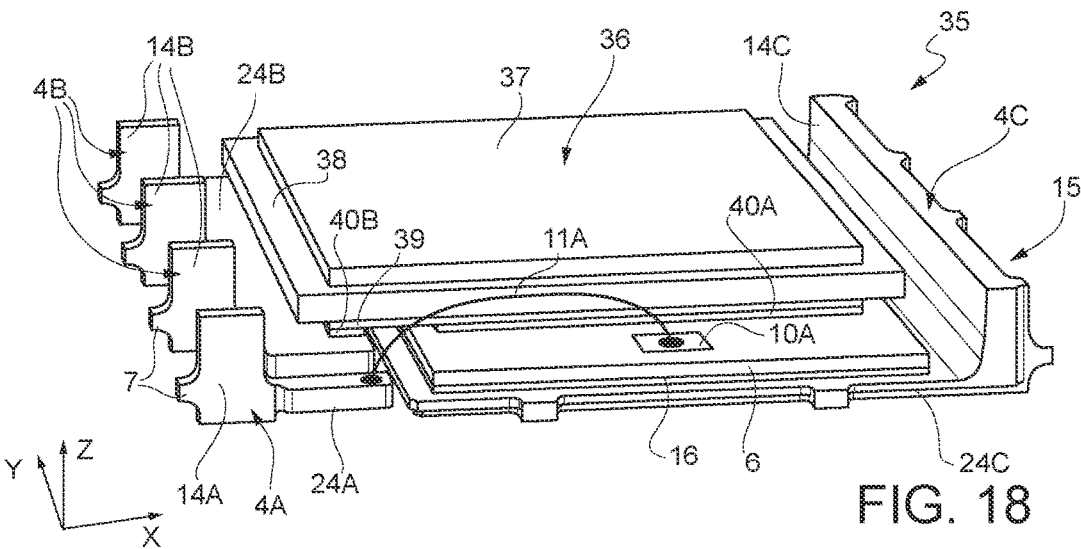

Also in this embodiment, the gate contact pad 10A is connected to the respective gate lead 4A via a bonding wire 11A, as may be seen in FIGS. 17 and 18.

The power device 35 of FIGS. 14-18 thus provides an even higher capacity of thermal dispersion, thanks to the presence of the insulating dissipative region 36.

The power device 35 of FIGS. 14-18 may be mounted on a substrate, on both sides thereof, with the leadframe 15 facing upwards or downwards, may be coupled to external heat sinkers, as discussed above with reference to FIGS. 9-13 and described hereinafter, and may be stacked.

Figure 19:
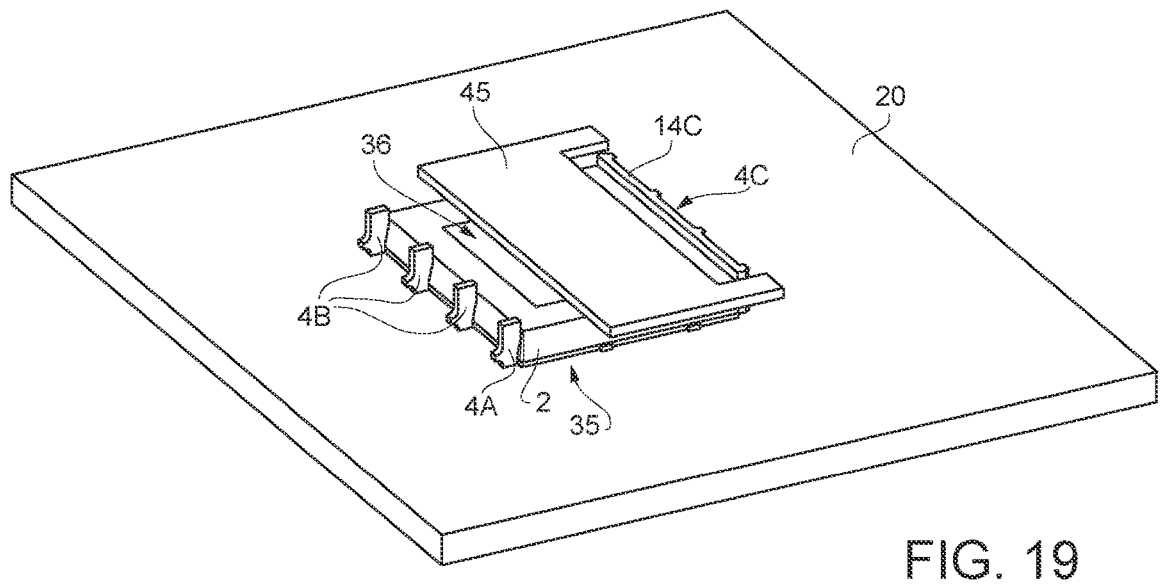
FIG. 19 is a perspective view of the power device of FIGS. 14-18 mounted on a support, in a configuration.

In particular, FIG. 19 shows a configuration where the power device 35 is bonded to the substrate 20, with the leadframe 15 facing downwards, the insulating dissipative region 36 facing upwards, and a heat sinker 45 arranged on top of the power device 35. Also in this case, as in FIG. 9, the pins 14A and 14B of the gate lead 4A and source leads 4B and the bar 14C of the gate lead 4C project upwards.

In this case, the heat sinker 45 has the C shape described with reference to the first and second heat sinkers 22, 23 of FIG. 12, but could have the same rectangular shape as the heat sinker 21 of FIG. 9.

In FIG. 19, the heat sinker 45 is in direct contact with the insulating dissipative region 36 and thus increases the dissipation capacity thereof.

Figure 20:
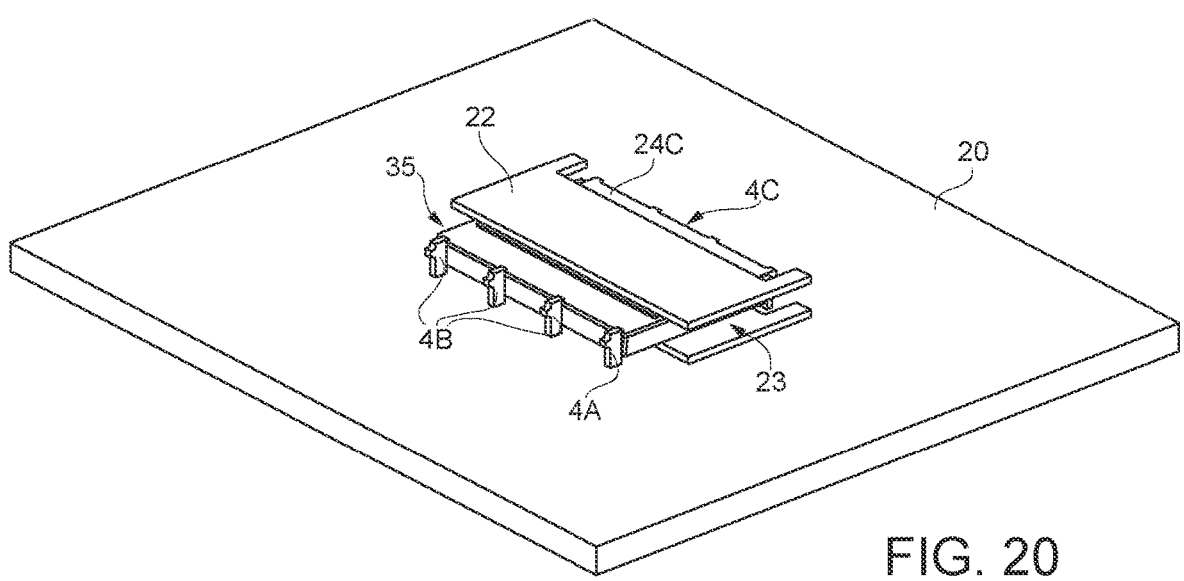
FIG. 20 is a perspective view of the power device of FIGS. 14-18 mounted on a support, in a different configuration.

FIG. 20 shows a configuration where the power device 35 is bonded to the substrate 20 with the leadframe 15 facing upwards, the insulating dissipative region 36 facing downwards (towards the substrate 20), and the heat sinkers arranged both on top of and underneath the power device 35, as in the configuration of FIG. 12.

In particular, in FIG. 20, the first heat sinker 22 is bonded to, and in contact with, the die-attach support 24C and is thus arranged at the same voltage as the drain pad (10C in FIG. 3). The second heat sinker 23 extends between the power device 35 and the support 20 in the gap due to the projecting leads 4A-4C (as described in detail with reference to FIGS. 12-13) and is in contact with the insulating dissipative region 36; the second heat sinker 23 is thus electrically insulated from the die 6. Also in this case, the heat sinkers 22, 23, the vertical wall 29 (if present) and the dissipating lamina 31 (if present) form a heat-dissipation structure for the die 6 (not visible). In this way, in the configuration of FIGS. 19 and 20, the power device 1 has a high thermal dissipation. Also the structure of FIGS. 19-20, in particular in presence of the vertical wall 29, whether in contact or not with the bar 14C, is designed, in any case, so as to respect the creepage criteria.

Figure 21:
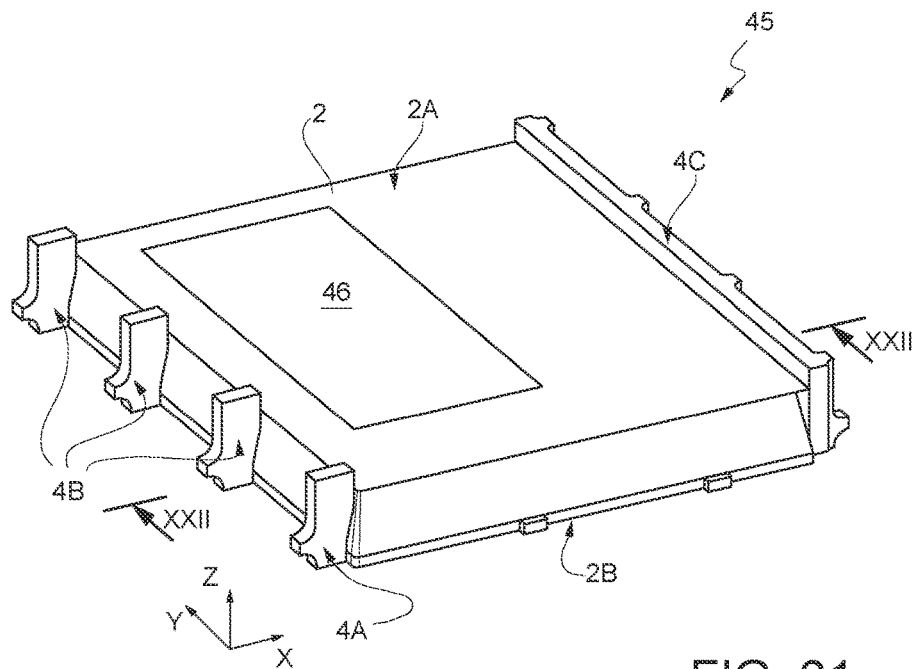
FIG. 21 is a perspective view of a packaged power device, according to a different embodiment.
Figure 22:
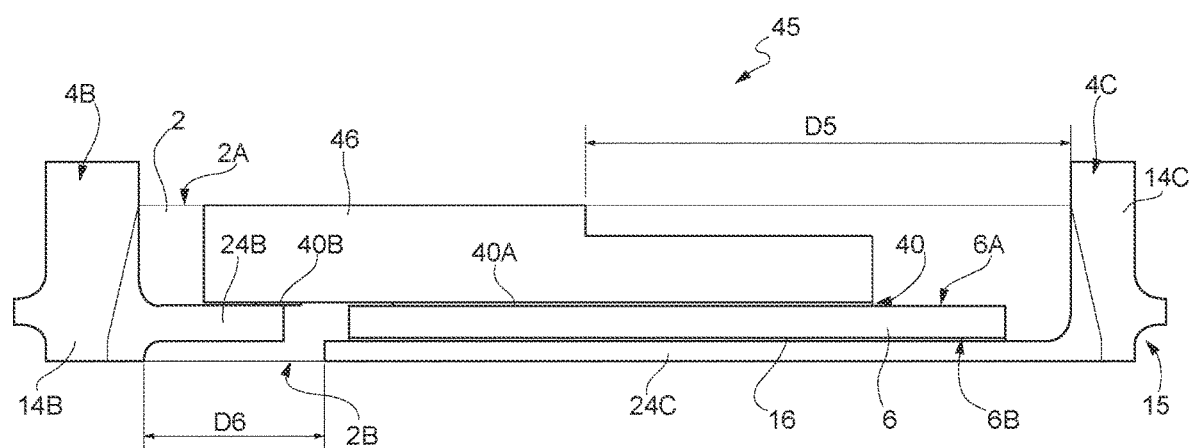
FIG. 22 is a cross-section, taken along line XXII-XXII of FIG. 21, of the power device of FIG. 21, with phantom parts.

FIGS. 21 and 22 show a power device 45 having an inner dissipating lamina, not insulated with respect to the die 6.

In particular, the power device 45 has a basic structure similar to the power devices 1 and 35 shown in FIGS. 1-8 and 14-18, so that similar parts are designated by the same reference numbers and will not be described any further.

The power device 45 of FIGS. 21-22 (having the same below and side views as the power device 1 of FIGS. 3 and 4-6 so that these views are not represented again) has the die 6 directly bonded to the leadframe 15 with its second face 6B (having the drain pad 10C, FIG. 8) and comprises a conductive dissipative region 46 (also known as conductive clip) embedded in the package 2 except for a top surface, flush with the first base 2A of the package 2.

The conductive dissipative region 46 is here formed as a single monolithic region, for example, of copper, and extends between the first base 2A, on one side, and the die 6, on the other. The conductive dissipative region 46 is in contact with the source pad 10B (FIG. 8) through the first adhesive portion 40A (not visible in FIG. 22) of the second adhesive layer 40 and with the inner portion 24B of the source leads 4B through the second adhesive portion 40B, as described with reference to FIG. 16 for the second conductive layer 39. The conductive dissipative region 46 thus electrically connects the source pad 10B and the source leads 4B, like the second conductive layer 39 in FIG. 18. In addition, also here, the conductive dissipative region 46 is laterally staggered with respect to the gate contact pad 10A (FIG. 8), analogously to the first insulating dissipative region 34 in FIG. 18. In a way not visible, the gate contact pad 10A and the gate lead 4A are here in mutual electrical contact through a copper wire, as shown in FIGS. 17 and 18.

Consequently, in this embodiment, the conductive dissipative region 46 is in direct electrical and thermal contact with the source region (not shown) of the power device 45 and provides a high thermal dispersion both on the underside (second base 2B of the package 2) and on the upper side (first base 2A of the package 2).

However, the conductive dissipative region 46 is not electrically insulated from the die 6. Thus, during sizing, the distance between the conductive dissipative region 46 and the bar 14C is designed so as to satisfy the provided insulation conditions (creepage).

To this end, in the embodiment shown in FIGS. 21-22, the conductive dissipative region 46 is shaped so that its top surface has a width (in a direction parallel to the second Cartesian axis X, i.e., along the distance between the gate and source pins 14A, 14B and the bar 14C) that is greater at its base in contact with the die 6 than at its portion facing the first base 2A of the package 2.

In particular, with this conformation, in the design stage, a fifth creepage distance D5 (FIG. 22) between the edge of the conductive dissipative region 46 (at the first base 2A of the package 2) and the bar 14C, as well as a sixth distance D6 between the edge of the die-attach support 24C and the base of the pins 14A, 14B of the gate lead 4A and source leads 4B are appropriate chosen.

The conductive dissipative region 46 may have a length (parallel to the first Cartesian axis Y) approximately equal to the source pad 10B (FIG. 8) of the die 6.

Figure 23:
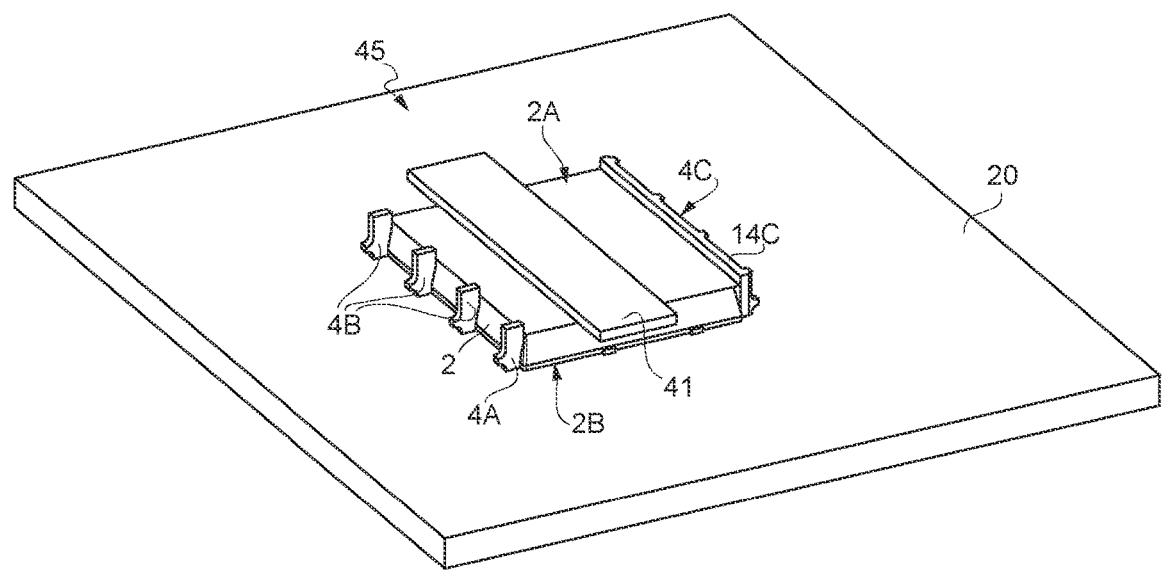
FIG. 23 is a perspective view of the power device of FIG. 21 mounted on a heat-dissipation support, in a configuration.
Figure 24:
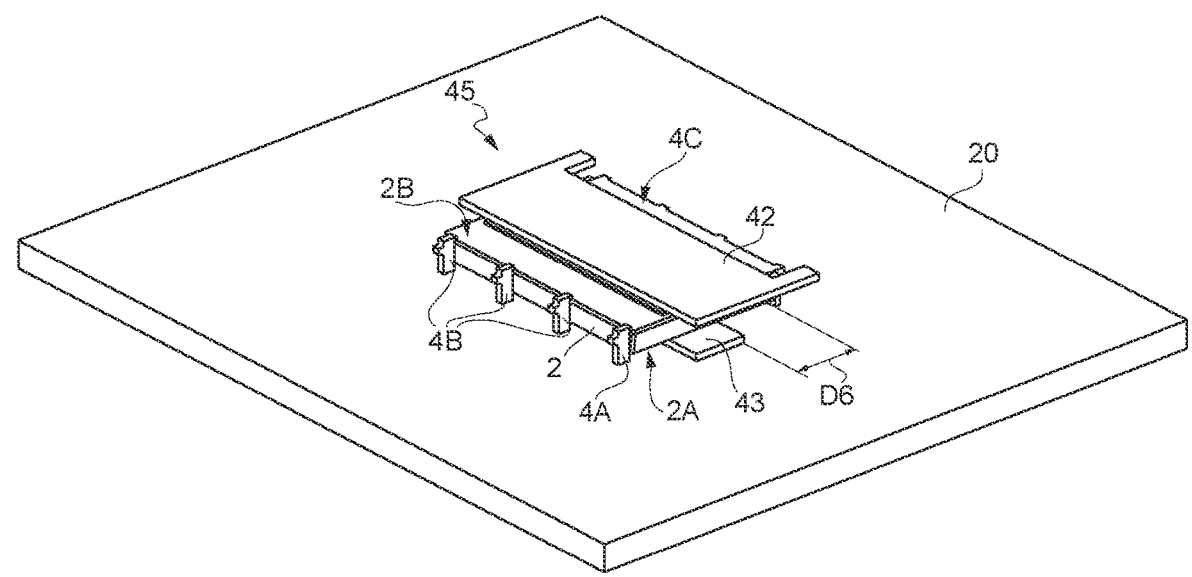
FIG. 24 is a perspective view of the power device of FIG. 21 mounted on a support, in a different configuration.

The power device 45 of FIGS. 21-22 may be mounted on the substrate 20 with the leadframe 15 facing downwards (the leads 4A-4C projecting upwards), as shown in FIG. 23, or with the leadframe 15 facing upwards (the leads 4A-4C projecting downwards), as shown in FIG. 24.

In FIG. 23, as shown in FIG. 9, a heat sinker 41 is bonded to the first base 2A of the package 2, for example, soldered or screwed to the insulating material thereof.

Here, the heat sinker 41 is in electrical and thermal contact with the conductive dissipative region 46 (not visible) and thus with the source pad 10B (FIG. 8).

In this way, a dual-face cooling is obtained as a result of the heat sinker 41 (arranged at the top) and the contact between the leadframe 15 (not visible in FIG. 23) and the back of the substrate 20, where a dissipating lamina 31 (FIG. 10) may be arranged, thermally and electrically coupled through connection vias 30, as shown in FIG. 10.

Here, in the design stage, the creepage distance between the heat sinker 41 and the bar 14C (analogous to the second creepage distance D2 of FIG. 9, but much greater, due to the connection of the heat sinker 41 to the source pad 10B, FIG. 8) is chosen using known criteria.

In FIG. 24, as in FIG. 12, a gap extends between the power device 45 and the substrate 20; a first heat sinker 42 is fixed to the second base 2B of the package 2 (on top thereof) and a second heat sinker 43 (having a rectangular shape) is bonded to the first base 2A of the package 2, in the gap between the substrate 20 and the package 2.

Here, the first heat sinker 42 is in electrical and thermal contact with the drain pad 10C (FIG. 3), and the second heat sinker 43 is in electrical and thermal contact with the source pad 10B (FIG. 8).

Also here, a double-face cooling is obtained.

The creepage is here given by the distance of the first heat sinker 42 from the gate and source leads 4A, 4B (analogous to the third creepage distance D3 of FIG. 12) and by the distance of the second heat sinker 43 from the bar 14C (seventh creepage distance D7), as well as by the distance between the two heat sinkers 42 and 43, which is equal to the thickness of the device 45.

Figure 25:
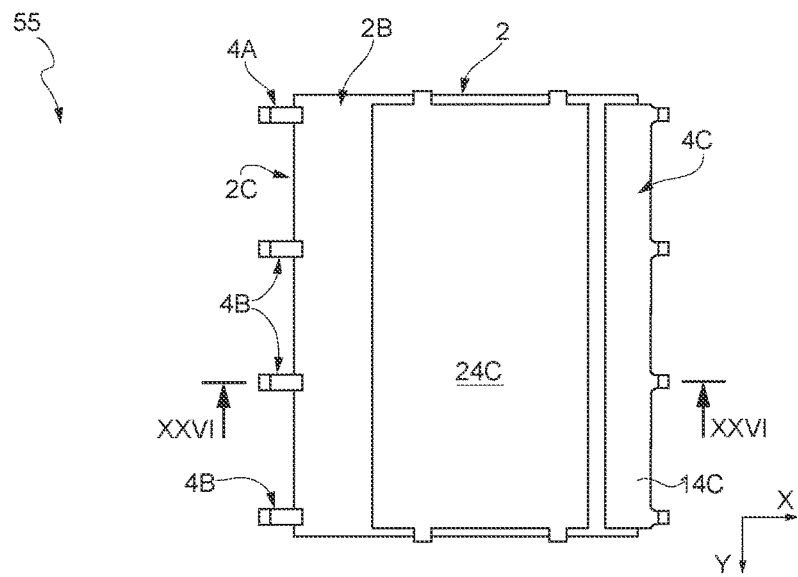
FIG. 25 is a top plan view of a further embodiment of the present packaged power device.
Figure 26:
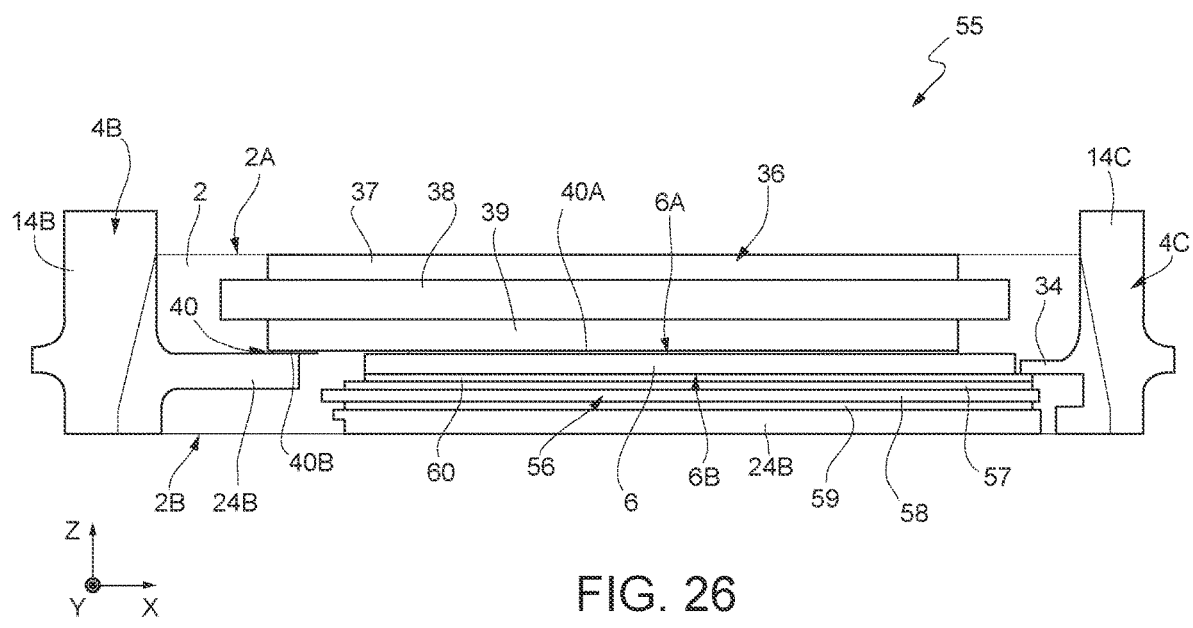
FIG. 26 is a cross-section, taken along line XXVI-XXVI of FIG. 25, of the power device of FIG. 25, with ghost parts.

FIGS. 25 and 26 refer to a power device 55 with electrical insulation of both faces 2A, 2B of the die 6, which is electrically connected with the outside world only through the leads 4A-4C.

In detail, the power device 55 (having same above view as the power device 35 of FIG. 14 and same side views as the power device 1 shown in FIGS. 4-6) has the die-attach support 24C separate from the bar 14C, as visible in the view from below of FIG. 25 and in the cross-section of the not packaged device of FIG. 26.

In detail, the power device 55 has a similar structure to the power device 35 of FIGS. 14-18, except for the separation of the die-attach support 24C, mentioned above, and for the presence of a second insulating dissipative region 56, in addition to the insulating dissipative region 36, hereinafter referred to, for clarity, as first insulating dissipative region 36.

The second insulating dissipative region 56 has a structure similar to the first insulating dissipative region 36 and is here formed as a DCB substrate including a first conductive layer 57, an intermediate insulating layer 58, and a second conductive layer 59, formed as described in detail with reference to FIG. 16 for the corresponding layers 37-39 of the first insulating dissipative region 36.

In a variant not shown, the insulating dissipative region 56 could itself form, and thus replace, the die-attach support 24C.

In the embodiment of FIGS. 25-26, the first conductive layer 57 of the second insulating dissipative region 56 is bonded, in particular glued, to the second face 6B of the die 6 through a third adhesive layer 60, of a conductive type, for example, a conductive solder paste. The second insulating dissipative region 56 (in particular, the first conductive layer 57 of the latter) and the third conductive adhesive layer 60 here have an area (in a plane parallel to the first plane XY of the Cartesian coordinate system) greater than the die 6 and laterally project beyond the die 6 (in the direction of the second Cartesian axis X) towards the bar 14C. The second conductive layer 59 of the second insulating dissipative region 56 is bonded to the die-attach support 24C. Consequently, in this embodiment, the die-attach support 24C is no longer electrically connected to the drain pad 10C (FIG. 8) of the power device 55.

The drain lead 4C has here a bonding projection 34, extending from the bar 14C towards the inside of the package 2 and such as to partially overlap the first conductive layer 57 of the second insulating dissipative region 56. The bonding projection 34 is glued to the third conductive adhesive layer 60 at the projecting portion thereof.

In this way, the drain pad 10C (FIG. 3) on the second face 6B of the die 6, the third conductive adhesive layer 60, and the drain lead 4C are in electrical connection; instead, the second face 2B of the power device 55 (formed by the die-attach support 24C) is electrically insulated from the die 6 by virtue of the intermediate insulating layer 58 of the second insulating dissipative region 56, and the second insulating dissipative region 56 provides a high thermal conductivity for the die.

The die 2 is, however, thermally connected both upwards (first base 2A of the package 2), through the first insulating dissipative region 36 (the exposed top face 2A whereof is electrically insulated thanks to the first conductive layer 37), and downwards (second base 2B), through the second insulating dissipative region 56.

The power device 55 of FIGS. 25 and 26 may be mounted in a way not represented with the leadframe 15 facing upwards or downwards, like the power device 35, as shown in FIGS. 19 and 20.

However, in this case, the first heat sinker 22, fixed to the second base 2B of the package 2, and specifically to the die-attach support 24C, is insulated with respect to the die 6, which does not lie directly on the die-attach support 24C. Even in the presence of the vertical wall 29 that connects the first heat sinker 22 to the second heat sinker 23, also the latter will be electrically insulated, since it is only in contact with the first insulating dissipative region 36, insulated with respect to the die 2. Also the structure of FIGS. 19-20, in particular in presence of the vertical wall 29, whether in contact or not with the bar 14C, is designed so as to respect the creepage criteria.

Figure 27:
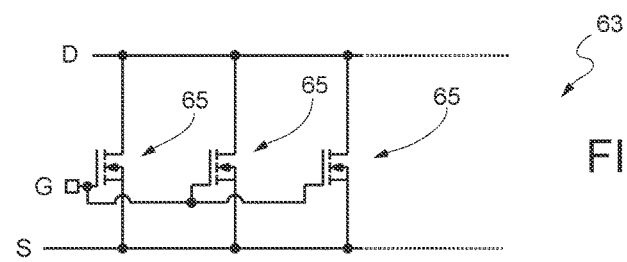
FIG. 27 shows an equivalent electrical diagram of a circuit arrangement obtainable by stacking the power devices of FIGS. 1-20 and 25-26.

FIG. 27 shows a parallel circuit arrangement 63 that may be implemented by stacking and parallel-connecting a plurality of power devices, designated as a whole by 65, each whereof may be formed by one of the power devices 1, 35 and 55 of FIGS. 1-20 and 24-25. Preferably, the stacked power devices 65 are all of the same type.

In detail, the parallel circuit arrangement 63 of FIG. 27 comprises a plurality of power devices 65 (three which are shown here), having mutually coupled gate terminals G, mutually coupled drain terminals D, and mutually coupled source terminals.

Figure 28:
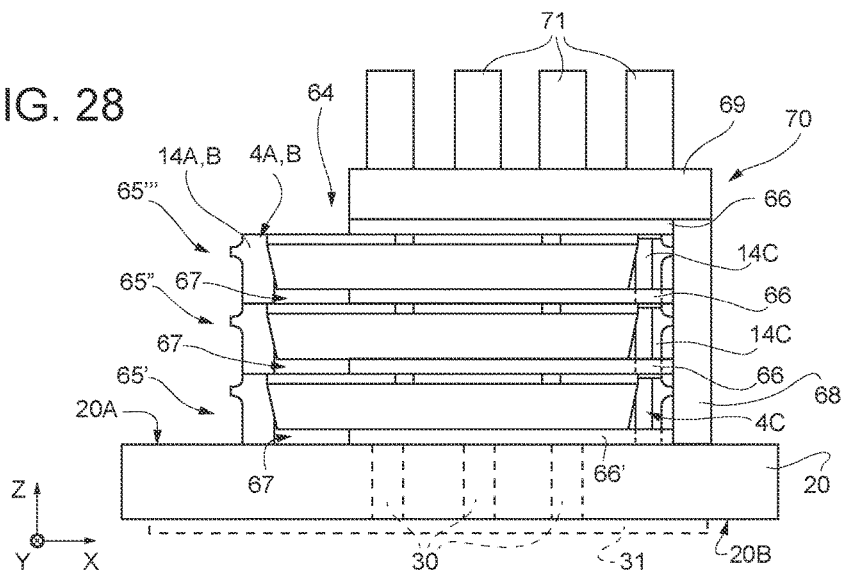
FIG. 28 is a front view, similar to FIG. 4, of a stack of power devices mounted on a support, in a configuration for implementing the circuit arrangement of FIG. 27.
Figure 29:
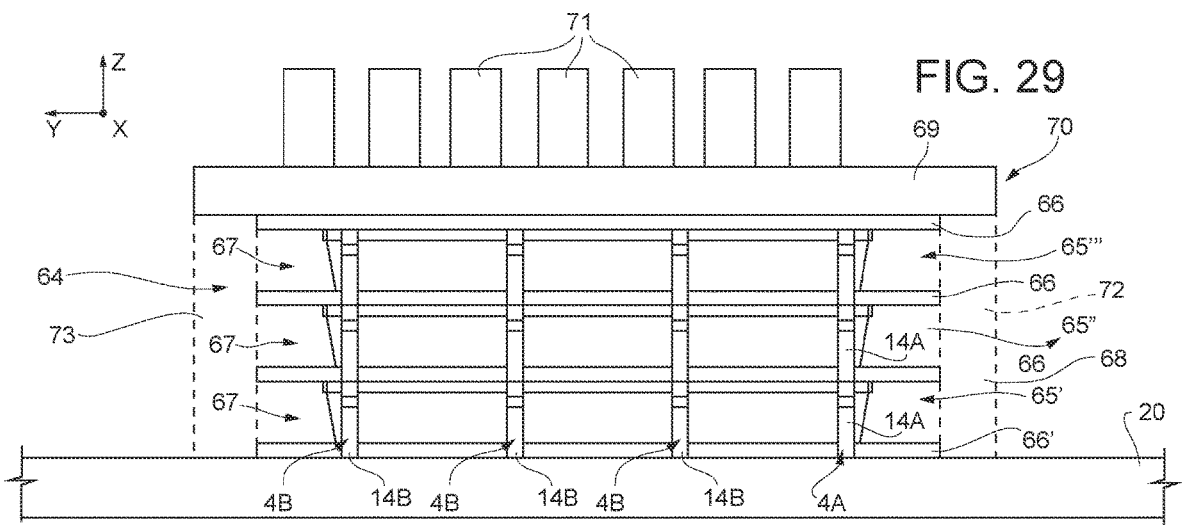
FIG. 29 is a left lateral view, similar to FIG. 5, of the stack of power devices of FIG. 28.
Figure 30:
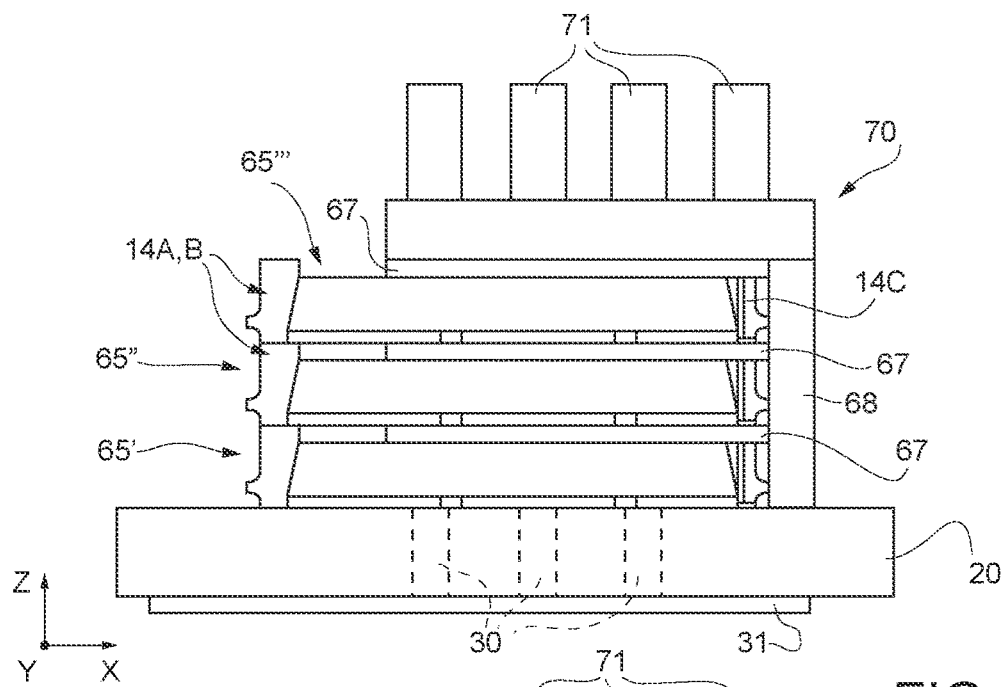
FIG. 30 is a front view, similar to that FIG. 4, of a stack of power devices mounted on a support, in another configuration for implementing the circuit arrangement of FIG. 27.

The circuit arrangement 63 may be implemented as shown in FIGS. 28-30.

FIGS. 28-29 show a possibility of stacking the power devices 65 in a configuration with the leadframes 15 (FIGS. 7, 8, 16-18) arranged facing upwards and the pins 14A, 14B and the bar 14C projecting downwards. The power devices 65 (which comprise a bottom power device 65', an intermediate power device 65'', and a top power device 65''' and are designated by prime signs when necessary or otherwise desirable to distinguish them) form a stack 64, are vertically arranged on top of each other and bonded to the first face 20A of the substrate 20, with the gate pins 14A mutually aligned in the vertical direction (parallel to the third Cartesian axis Z) and in direct contact with each other (possibly with interposition of an adhesive, for example, a solder paste, not shown), the source pins 14B mutually aligned and in direct contact with each other (possibly with interposition of an adhesive, for example, a solder paste, not shown), and the bars 14C mutually aligned and in direct contact with each other (possibly with interposition of an adhesive, for example, a solder paste, not shown).

Thanks to the mutual contact of the gate pins 14A, source pins 14B, and bars 14C of the power devices 65, these are parallel-connected as represented in FIG. 27.

Here, the pins 14A, 14B project downwards so that the package 2 of the bottom power device 65' is arranged at a distance from the substrate 20 by a gap 67 having a height equal to the spacing distance H3 (FIG. 4). Furthermore, the intermediate power device 65'' and the top power device 65''' are arranged at a distance equal to the value of the gap 67 from the bottom power device 65' and from the intermediate power device 65'', respectively.

Heat sinkers 66 are arranged between the power devices 65, in the gaps 67, underneath the bottom power device 65' (where the heat sinker is designated by 66'), between the bottom power device 65' and the substrate 20, between the intermediate power device 65'' and the top power device 65''', as well as above the top power device 65'''. The heat sinkers 66 are similar to the first and second heat sinkers 22, 23, for example, of FIGS. 12, 13, with legs 27 extending laterally (before and behind the plane of FIG. 29) to the bars 14C and also mutually aligned.

A first vertical wall 68 extends laterally to the power devices 65, throughout the height of the stack 64, in contact with the drain projections 8; a horizontal wall 69 extends over the stack 64 of power devices 65, in direct contact with the heat sinker 66 arranged at the top and with the top edge of the first vertical wall 68.

In order to respect the creepage distances, the horizontal wall 69 has a width (in a direction parallel to the second Cartesian axis X) that is smaller than, and in any case does not exceed, the profile of the leadframe 15 of the underlying power device 65 and thus of the corresponding heat sinker 66 (which is aligned along the first Cartesian axis Y to the profile of the leadframe 15). In addition, the horizontal wall 69 has a length (in a direction parallel to the first Cartesian axis Y) greater than that of the power devices 65, as shown in FIG. 29, where the first vertical wall 68 is represented by a dashed line.

Column elements 71 extend above the horizontal wall 69, in contact therewith to increase the dissipative surface.

The horizontal wall 69, the first vertical wall 68, the heat sinkers 66, and the column elements 71 are in direct contact with each other and form a dissipation structure 70 that surrounds the stack 64 of power devices 65.

The dissipation structure 70 may further comprise further vertical walls, perpendicular to the first vertical wall 68, to increase further the dissipative capacity of the dissipation structure 70. For instance, FIG. 29 shows a second vertical wall 72, represented with a dashed line and arranged on the right-hand side of the dissipation structure 70 (on the side close to the gate lead 4A), adjacent to and in contact with the heat sinkers 66. Possibly, a third vertical wall 73 may be provided, also represented with a dashed line in FIG. 29, and arranged on the left-hand side of the dissipation structure 70, close to the source leads 4B, and also adjacent to and in contact with the heat sinkers 66.

In addition, in the arrangement shown, where the drain projections 8 are in contact with the vertical wall 68, there is thermal and electrical continuity between the drain leads 4C and the dissipation structure 70.

If the vertical wall 68 extends at a distance from the drain projections 8, there is electrical connection between the drain leads 4C and the dissipation structure 70 only when the power devices 65 are made like the power devices 1 and 35 of FIGS. 1-8 and 14-18.

When the power devices 65 are made like the power devices 55 of FIGS. 25 and 26 and the vertical wall 68 is arranged at a distance from the drain projections 8, the dissipation structure 70 is electrically insulated from the drain leads 4C. Also in the embodiment of FIGS. 28-29, as represented with dashed lines in FIG. 29, the substrate 20 may comprise connection vias 30 and a dissipating lamina 31 fixed to the second face 20B of the substrate 20, as in FIGS. 10 and 11.

FIG. 30 shows a possible implementation of the circuit arrangement of FIG. 27 with the power devices 65 stacked in a configuration with the leadframes 15 (FIGS. 7, 8, and 16-18) arranged facing downwards (towards the substrate 20) and with the pins 14A, 4B and the bar 14C projecting upwards.

Here, the power devices 65 are stacked on top of each other with the gate leads 4A, the source leads 4B, and the drain lead 4C in mutual contact, as described above with reference to FIGS. 28 and 29, even though they are turned upside down, and the heat sinkers 66 (having, for example, the same shape as the first and second heat sinkers 22, 23 of FIGS. 9 and 19) extend between the bottom power device 65' and the intermediate power device 65", between the intermediate power device 65" and the top power device 65''', as well as above the top power device 65'''. The bottom power device 65' is directly fixed to the substrate 20, as in the configurations of FIGS. 9 and 19.

Figure 31:
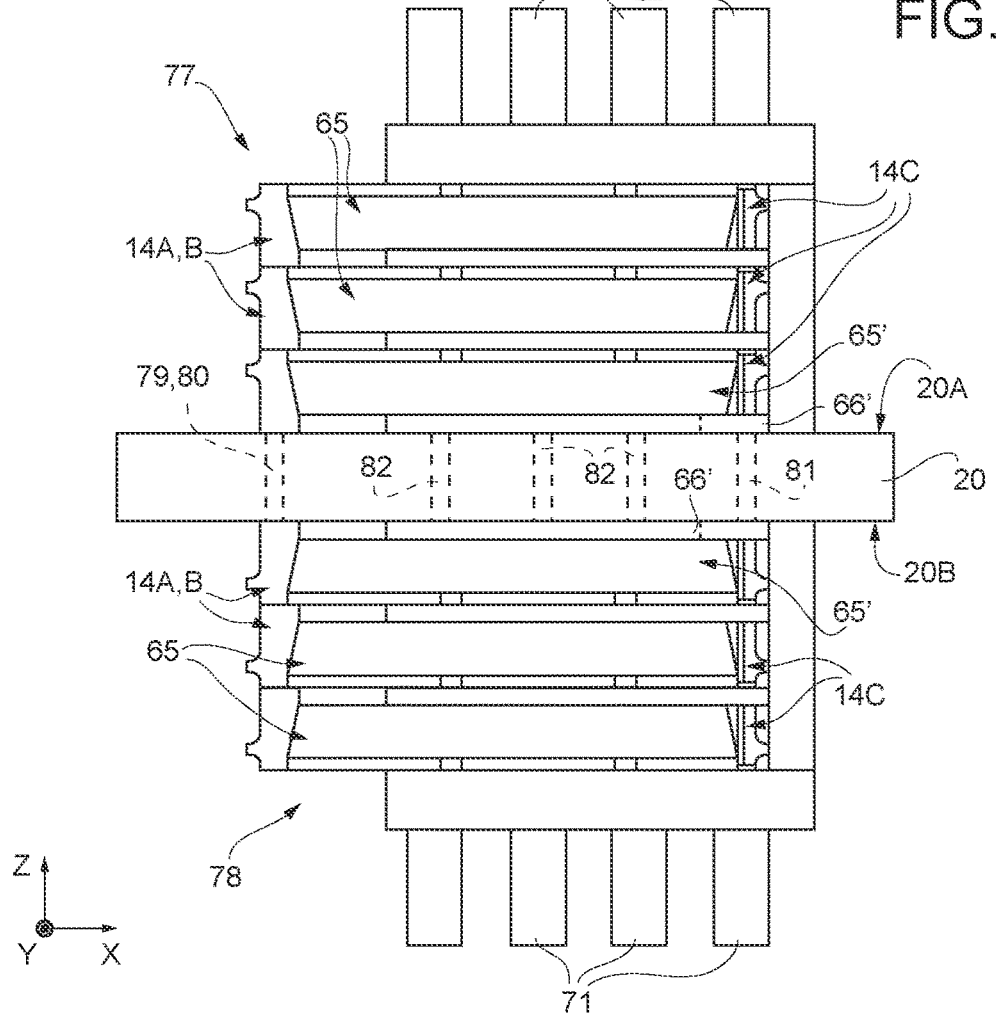
FIG. 31 is a front view, similar to FIG. 4, of two stacks of power devices mounted on a support, for implementing a different circuit arrangement.

FIG. 31 shows a possible implementation of the circuit arrangement of FIG. 27 with six power devices 65, arranged on both sides of the substrate 20.

In detail, in FIG. 31, three power devices 65 are stacked on top of each other to form a first stack 77 bonded to the first face 20A of the substrate 20, analogously to what described with reference to FIGS. 28 and 29. Three other power devices 65 are stacked on top of each other to form a second stack 78, which is bonded to the second face 20B of the substrate 20 and has a specular structure with respect to the substrate 20. Consequently, the components of the second stack 78 are designated by the same reference numbers as those of the first stack 77.

In both of the stacks 77 and 78, the power devices 65 are mounted in the configurations of FIGS. 12-13 and 20, i.e., with the power devices 65 bonded to the substrate 20 with the leadframe 15 (FIG. 7) remote from the substrate 20 (upwards in the first stack 77 and downwards in the second stack 78) and the pins 14A and 14B and the bars 14C projecting towards the substrate 20 (downwards in the first stack 77 and upwards in the second stack 78).

The substrate 20 has electrically conductive vias mutually connecting the power devices 65 of the two stacks 77 and 78.

In detail, a first conductive via 79 passes right through the substrate 20 between the gate pin 14A of the bottom power device 65' of the first stack 77 and the gate pin 14A of the bottom power device 65' of the second stack 77, electrically connecting them together.

Second conductive vias 80 (hidden from the first via 79 in FIG. 31, aligned thereto in a direction parallel to the first Cartesian axis Y) extend through the substrate 20 between the source pins 14B of the bottom power device 65' of the first stack 77 and the source pins 14B of the bottom power device 65' of the second stack 77, electrically connecting them together.

Third conductive vias 81 extend through the substrate 20 between the bar 14C of the bottom power device 65' of the first stack 77 and the bar 14C of the bottom power device 65' of the second stack 78, electrically connecting them together (it is noted that, in FIG. 31, the portion of the bars 14C of the bottom power transistors 65' projecting with respect to the first bases 2A is hidden by the legs 27 of the heat sinkers 66—see, for example, FIG. 12).

The power devices 65 of each of the two stacks 77 and 78 are thus parallel-connected, as shown in FIGS. 29-29. Further, the first, second, and third conductive vias 79-82 connect the two stacks 77 and 78 in parallel.

In practice, in this configuration with six power devices 65, the first, second, and third conductive vias 79-81 electrically connect the gate B, source S, and drain D terminals of the power devices 65, according to the electrical scheme of FIG. 27.

In FIG. 31, fourth conductive vias 82 extend through the substrate 20 between the heat sinkers 66' of the stacks 77, 78 directly in contact with the substrate 20. The fourth conductive vias 82 connect thermally, but not electrically, the power devices 65 of the first and second stacks 77, 78.

Figure 32:
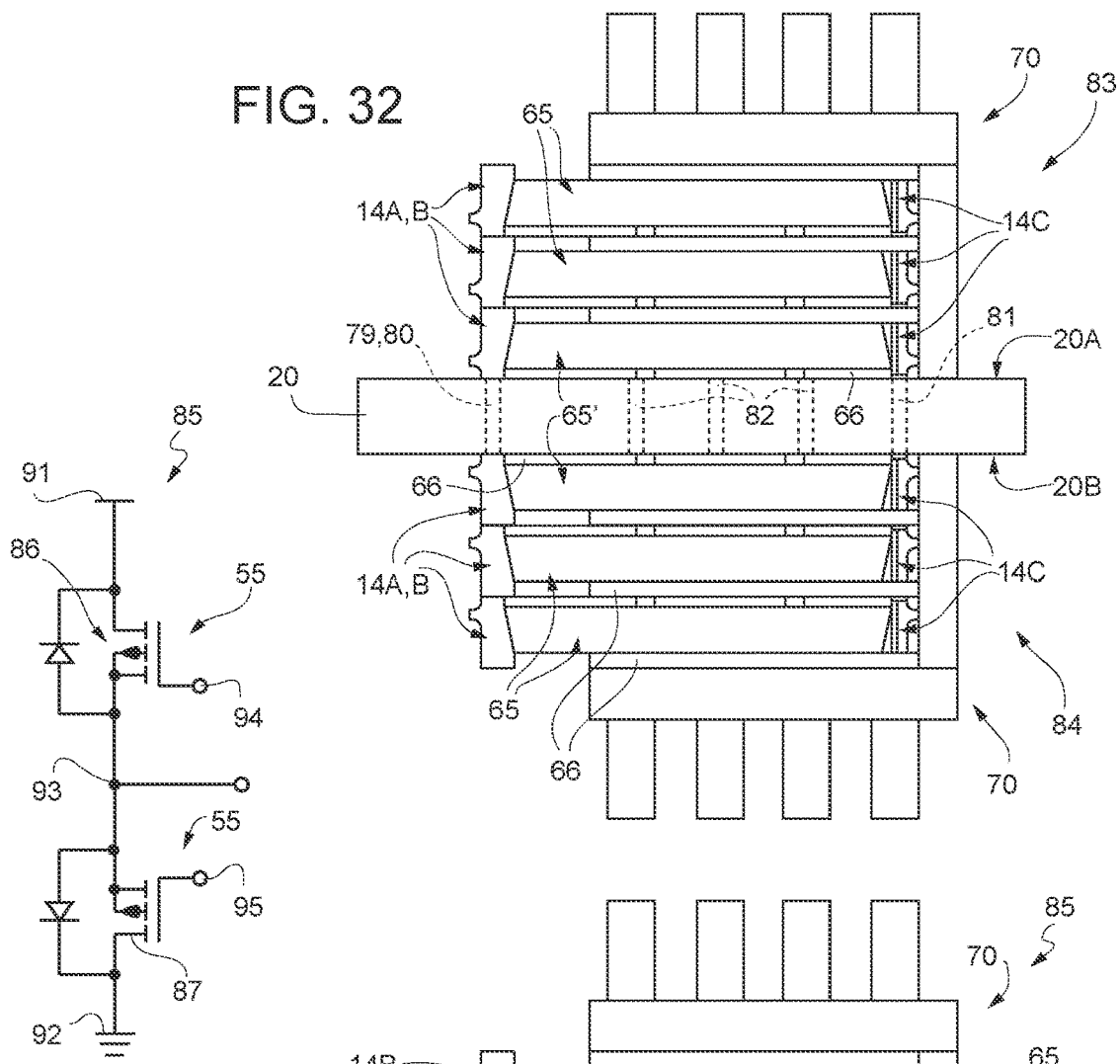
FIG. 32 is a front view, similar to FIG. 31, of a stack of power devices mounted on a support according to a different configuration.

FIG. 32 shows a different possible implementation of the circuit arrangement of FIG. 27 for six power devices 65, on both sides of the substrate 20, arranged upside down with respect to FIG. 31.

In detail, in FIG. 32, the power devices 65 are mounted so as to form a third stack 83 and a fourth stack 84, according to the configurations of FIGS. 9-11 and 19, i.e., with the power devices 65 fixed to the substrate 20 with the leadframe 15 (FIG. 7) in a closer position to the substrate 20 (downwards in the third stack 83 and upwards in the fourth stack 84), with the pins 14A and 14B and the bars 14C projecting opposite to the substrate 20 (upwards in the third stack 83 and downwards in the fourth stack 84).

Apart from the orientation, the third and fourth stacks 83, 84 are similar to what described with reference to FIG. 31 and are coupled to a respective dissipation structure, which has the same shape and arrangement as the dissipation structure 70 described above and is thus designated by the same reference number.

In addition, the first, second, and third conductive vias 79-81 extend through the substrate 20 for electrically coupling the gate and source pins 14A, 14B and the bars 14C. Also here, the fourth conductive vias 82 extend through the substrate 20 and electrically and thermally couple the bottom devices 65' in contact with the substrate 20.

With the configuration of FIG. 32, when the power devices 65 are made as described with reference to FIGS. 1-8 and 14-18, where the die-attach supports 24C (not visible in FIG. 32) are exposed and face the respective second base 2B of the packages 2 (see, for example, FIG. 7), the drain leads 4C are electrically connected also through the fourth conductive vias 82.

When the power devices 65 are made as described with reference to FIGS. 25-26, where the second insulating dissipative regions 56 are arranged between the die-attach supports 24C and the respective second bases 2B, the fourth conductive vias 82 provide anyway thermal-dissipation paths.

Also the first, second, and third conductive vias 79-81 contribute to the thermal dissipation.

For the rest, the configuration of FIG. 32 is similar to that of FIG. 31.

Figure 33:
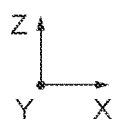
FIG. 33 shows an equivalent electrical diagram of a different circuit arrangement obtainable by stacking the power devices of FIGS. 25-26.

FIG. 33 shows a half-bridge circuit 85 that may be implemented by stacks of power devices 65, such as the power devices 55 of FIGS. 25-26.

In particular, the half-bridge circuit 85 comprises a first MOSFET 86 and a second MOSFET 87, series-connected between a first node and a second node at reference potentials 91, 92. An intermediate node 93 between the first and second MOSFETs 86, 87 forms an output terminal of the half-bridge circuit 85.

The first MOSFET 86 has its drain terminal D coupled to the first node at reference potential 91, its source terminal S coupled to the intermediate node 93, and its gate terminal G coupled to a first control node 94. The second MOSFET 87 has its drain terminal D coupled to the intermediate node 93 and to the source terminal S of the first MOSFET 86, its source terminal S coupled to the second node at reference potential 92, and its gate terminal G coupled to a second control node 95.

Figure 34:
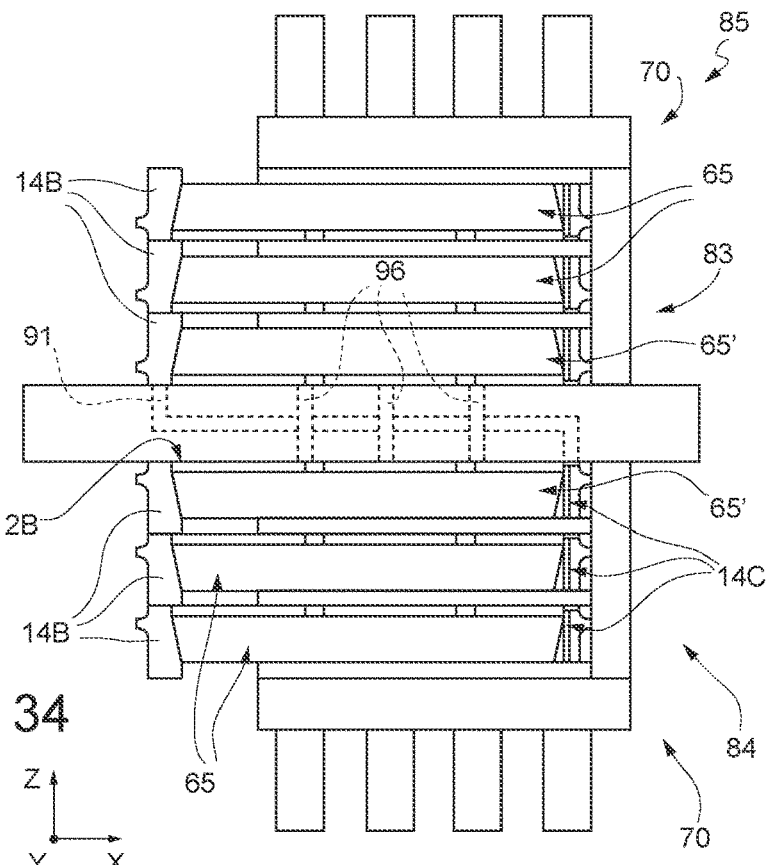
FIG. 34 is a front view, similar to FIG. 4, of a stack of power devices of the type shown in FIGS. 25-26 mounted on a support, in a configuration for implementing the circuit arrangement of FIG. 33.

The first and second MOSFETs 86, 87 may be implemented by the third stack 83 and the fourth stack 84, respectively, of FIG. 32, where the third and fourth stacks 83, 84 are here connected as shown in FIG. 34 and described hereinafter.

In FIG. 34, the power devices 65 are made as described with reference to FIGS. 25-26, so that the die-attach supports 24C (FIG. 26) of the power transistors 65 (and in particular the die-attach supports 24C of the bottom power transistors 65') are insulated with respect to the bars 14C.

Here, fifth conductive vias 96 extend through the substrate 20 between the first and second faces 20A, 20B of the substrate 20. In particular, the fifth conductive vias 96 extend between the source pins 14B of the bottom power transistor 65' of the third stack 83 and the bar 14C of the bottom power transistor 65' of the fourth stack 84 and connect them electrically together to form the intermediate node 93 of FIG. 33.

Furthermore, one or more sixth conductive vias 97 extend through the substrate 20 (without intersecting the fifth conductive vias 96) and connect the power devices 65 of the third and fourth stacks 83, 84 thermally but not electrically, since the bottom bases 2B of the bottom power transistors 65' (in contact with the substrate 20) are insulated (FIG. 26).

The power devices 1, 35, 45, 55 described herein have numerous advantages.

In particular, the projecting configuration of the outer portions of the gate, source, and drain leads (pins 14A, 14B, and bar 14C) allows the power device to be arranged in two positions rotated through 180° about a horizontal axis, and to simply couple one or two heat sinkers 21, 22, 23, thus increasing the dissipation surface.

Furthermore, the projecting portions of the gate, source, and drain leads 4A, 4B and 4C allow different power devices to be stably stacked (in particular in presence of the heat sinkers) and easily connected so as to increase the total electrical performance thereof (if they are connected in the parallel configuration shown in FIG. 27) or to provide, for the power devices 55 of FIGS. 25-26, more complex circuit configurations (such as the half-bridge arrangement shown in FIG. 33), thus enabling a high thermal dissipation.

Manufacture of the described power device requires only simple modifications to the structure of the leadframe, and may thus be obtained at costs comparable with those of the power devices manufactured using the same technology.

The described power devices may be easily connected according to different circuit arrangements.

Finally, it is clear that modifications and variations may be made to the power device and to the circuit arrangements described and shown herein, without thereby departing from the scope of the present disclosure, as defined in the attached claims. For instance, the various embodiments described may be combined so as to provide further solutions.

In addition, the heat sinkers 21, 22 and 23 may have any shape. In particular, the heat sinker 21 of FIGS. 9-11 may be C-shaped, ensuring the creepage distance in the direction of the first Cartesian axis Y. In this case, there may be provided one or more vertical walls, such as the vertical walls 29 of FIG. 13 or 72 of FIG. 29.

By assembling a number of power devices 65 in two stacks, the power devices of one stack may be rotated through 180° about a vertical axis (parallel to the third Cartesian axis Z) of the stacks 77, 78, or 83, 84, in particular for providing different circuit arrangements.

For instance, in the half-bridge configuration of FIG. 34, it is possible to rotate by 180° all the power devices 65 (here provided as power devices 55) of a same stack. Further, these may be arranged upside down and have the arrangement shown for the stacks 78 and 77 in FIG. 31.

It is also possible to use different combinations of arrangements, for example, by arranging all the power devices in the top stack as represented for the first stack 77 (and corresponding dissipation structure 70) of FIG. 31, and all the power devices in the bottom stack as represented for the fourth stack 84 (and corresponding dissipation structure 70) of FIG. 34. In this case, the connections may be obtained through the fifth and sixth conductive vias 96, 97, as shown in FIG. 34, for forming the half-bridge topology of FIG. 33, since the power devices of a same stack are in parallel to each other.

In addition, even though only two different circuit arrangements that may be obtained with the power devices and the stacks of power devices have been shown and described, other circuits may be advantageously provided.

Finally, a vertical dissipating structure similar to the first vertical wall 68 of FIG. 30 may be arranged on the side the stack of source leads 4B in the stacks 77, 78, 83, 84 of FIGS. 31, 32, and 34, but arranged on the opposite side and in contact with only the three stacks of source pins 14B (and thus insulated with respect to the stack of gate pins 14A).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a molding compound including a first sidewall and a surface transverse to the first sidewall;
   a first lead including a die attach portion and a lead portion coupled to the die attach portion, the lead portion extends outward from the first sidewall of the molding compound and extends outward from the surface of the molding compound;
   a die coupled to the die attach portion by an adhesive, the die including:
      a first surface coupled to the adhesive;
      a second surface opposite to the first surface;
      a first contact at the second surface; and
      a second contact at the second surface and spaced apart from the first contact;
   a second lead spaced apart from the first lead;
   a third lead spaced apart from the second lead;
   a first bonding wire coupling the first contact to the second lead; and
   a second bonding wire coupling the second contact to the third lead.

2. The device of claim 1, wherein the first lead is a drain lead, the second lead is a gate lead, and the third lead is a source lead.

3. The device of claim 1, wherein:
the die attach portion of the first lead includes:
a third surface;
a fourth surface opposite to the third surface; and
a first dimension that extends from the third surface to the fourth surface;
the adhesive is on the fourth surface of the die attach portion and couples the die to the fourth surface of the die attach portion; and
the first lead further includes:
an outer portion including an end surface spaced outward from the surface of the molding compound and opposite to the fourth surface; and
a second dimension that extends from the fourth surface to the end surface, the second dimension being greater than the first dimension.

4. The device of claim 3, further comprising a molding compound that encases the die, the first bonding wire, the second bonding wire, and the die attach portion of the first lead.

5. The device of claim 4, wherein the outer portion of the first lead extends outward from the molding compound and is exposed from the molding compound.

6. The device of claim 4, wherein:
the second lead further includes an inner portion and an outer portion, the inner portion of the second lead being encased by the molding compound, and the outer portion of the second lead extending outward from the molding compound and being exposed from the molding compound; and
the third lead further includes an inner portion and an outer portion, the inner portion of the third lead being encased by the molding compound, and the outer portion of the third lead extending outward from the molding compound and being exposed from the molding compound.

7. The device of claim 1, wherein:
the molding compound further includes a second sidewall, the second sidewall is opposite to the first sidewall and is transverse to the surface;
the second lead extends outward from the second sidewall of the molding compound and extends outward from the surface of the molding compound; and
the third lead extends outward from the second sidewall of the molding compound and extends outward from the surface of the molding compound.

8. A device, comprising:
a first lead including a die attach portion;
a die including a first surface and a second surface opposite to the first surface, the die being coupled to the die attach portion at the first surface of the die;
a second lead spaced apart from the first lead, the second lead being in electrical communication with the die;
a third lead spaced apart from the second lead, the third lead being in electrical communication with the die; and
a conductive dissipative region coupled to the second surface of the die and coupled to the second lead, the conductive dissipative region including:
a third surface coupled to the die and coupled to the second lead;
a first portion having a fourth surface opposite to the third surface and a first dimension extending from the third surface to the fourth surface; and
a second portion having a fifth surface opposite to the third surface and a second dimension extending from the third surface to the fifth surface, the second dimension being less than the first dimension.

9. The device of claim 8, wherein the first lead is a drain lead, the second lead is a gate lead, and the third lead is a source lead.

10. The device of claim 8, wherein the first portion is coupled to the second lead and overlaps the second lead, and the second portion overlaps the die.

11. The device of claim 8, further comprising a molding compound encasing a die attach portion of the first lead to which the die is coupled and encasing respective inner portions of the second lead and the third lead, respectively, and the molding compound encasing the die and the conductive dissipative region.

12. The device of claim 11, wherein:
the molding compound covers the fifth surface of the second portion of the conductive dissipative region; and
the fourth surface of the first portion of the conductive dissipative region is exposed from the molding compound.

13. The device of claim 11, wherein a heat sink structure is coupled to the fourth surface of the first portion of the conductive dissipative region exposed from the molding compound.

14. The device of claim 11, wherein the first lead, the second lead, and the third lead include respective outer portions that protrude outward from the molding compound and are exposed from the molding compound.

15. A device, comprising:
a substrate including a surface;
a first package on the surface of the substrate, the first package including:
a first molding compound including a first external surface and a second external surface opposite to the first external surface;
a first die in the first molding compound; and
a plurality of first leads including first protrusions protruding outward and away from the first external surface of the first molding compound and along a first peripheral region of the first molding compound;
a first heat sink structure at the first external surface of the first molding compound, the first heat sink structure being between respective first protrusions of the plurality of first protrusions, and the first heat sink structure is between the surface of the substrate and the first external surface of the molding compound;
a second package on the first package, the second package including:
a second molding compound including a third external surface and a fourth external surface opposite to the third external surface;
a second die in the second molding compound; and
a plurality of second leads including second protrusions protruding outward and away from the third external surface of the second molding compound and along a second peripheral region of the second molding compound; and
a second heat sink structure at the third external surface of the second molding compound, the second heat sink structure being between respective second protrusions of the plurality of second protrusions, and the second heat sink structure is between the second external surface and the third external surface.

16. The device of claim 15, further comprising a wall on the surface of the substrate, and the wall is in contact with respective first leads of the plurality of first leads, is in contact with respective second leads of the plurality of second leads, is in contact with the first heat sink structure, and is in contact with the second heat sink structure.

17. The device of claim 16, further comprising a transverse wall coupled to an end of the wall spaced apart from the substrate, the transverse wall is transverse to the wall, and the transverse wall overlaps the first package, the second package, the first heat sink structure, and the second heat sink structure.

18. The device of claim 17, further comprising a plurality of column elements coupled to a side of the transverse wall facing away from the surface of the substrate.

19. The device of claim 15, further comprising a wall on the surface of the substrate, and the wall is in contact with the first heat sink structure and is in contact with the second heat sink structure.

20. The device of claim 19, further comprising a transverse wall coupled to an end of the wall spaced apart from the substrate, the transverse wall is transverse to the wall, and the transverse wall overlaps the first package, the second package, the first heat sink structure, and the second heat sink structure.

21. The device of claim 20, further comprising a plurality of column elements coupled to a side of the transverse wall facing away from the surface of the substrate.

\* \* \* \* \*